United States Patent [19]
Jiang et al.

[11] Patent Number: 5,867,405
[45] Date of Patent: Feb. 2, 1999

[54] FERROELECTRIC SIMULATOR, FERROELECTRIC METHOD OF MANUFACTURE, AND METHOD OF SIMULATION

[75] Inventors: Bo Jiang, Austin; Peter Zurcher, Dripping Springs; Robert E. Jones, Austin, all of Tex.

[73] Assignee: Motorola, Inc., Schaumburg, Ill.

[21] Appl. No.: 609,696

[22] Filed: Mar. 1, 1996

[51] Int. Cl.⁶ .................................................... G06F 9/455
[52] U.S. Cl. ........................................ 364/578; 395/500
[58] Field of Search ................................ 364/578, 488; 395/500

[56] References Cited

PUBLICATIONS

Evans et al., "A Ferroelectric Capacitor Simulation Model", IEEE 7th Int'l Sypm Appl. of Ferroelectrics, 1991, p. 692–697.

Clark et al. "Ferroelectric Thin–Film Connections in IC Neural Networks" IEEE 7th Int'l Symp Appl. of Ferroelectrics, 1991, 730–2.

Schwank et al. "Total–Dose Radiation–Induced Degration of Thin Film Ferroelectrics Capacitors", IEEE Trans on Nuclear Sci, vol. 37, No. 6, Dec. 1990 pp. 1703–1712.

Contla et al., "Simple Model For the Design of Polymeric Piezelectric Ultrasonic Transducers", IEEE Conf. on Acoustic Sensing & Imaging (Mar. 1993) pp. 1–6.

Dunn, "A Ferroelectric Capacitor Macromodel & Parameterization Algorithm For Spice Simulation", IEEE Trans on Ultrasonics, Ferroelectrics & Freq. Ctrl, vol. 41 No. 3, May 1994 pp. 360–369.

*Primary Examiner*—Kevin J. Teska
*Assistant Examiner*—Tyrone V. Walker
*Attorney, Agent, or Firm*—Keith E. Witek

[57] ABSTRACT

A method and apparatus for simulating the design of a ferroelectric circuit uses a processor (501). The processor (501) executes a simulator (540) from memory (538) to exercise a ferroelectric model (544). The ferroelectric model (544) keeps track of turning points or extrema points (FIGS. 11–17) in a history data file (542). This history data in file (542) is then used with eqs. 3–11 herein to curve model between voltage/charge history points from the file (542) and a current operating voltage/charge point of the ferroelectric device. This curve modeling effectively and efficiently determines the charge stored in a ferroelectric capacitor (FIGS. 7 or 8) as voltage across the ferroelectric capacitor is varied over time and temperature. History data points are selectively removed from the data file (542) to maintain and enable time-efficient determination of charge (Q) in the ferroelectric device over time.

68 Claims, 9 Drawing Sheets

5,867,405

FERROELECTRIC SIMULATOR, FERROELECTRIC METHOD OF MANUFACTURE, AND METHOD OF SIMULATION

FIELD OF THE INVENTION

The present invention relates generally to integrated circuit manufacturing and more particularly, simulating and manufacturing ferroelectric memory devices for integrated circuits.

BACKGROUND OF THE INVENTION

In order for computers to function, the integrated circuit industry must manufacture memory integrated circuits (ICs) or integrated circuits which contain memory cells so that data can be stored. This stored data is then manipulated by a central processing unit (CPU) IC to perform useful operations. One type of memory cell manufactured by the integrated circuit industry for the computer industry is referred to as a ferroelectric memory cell.

Ferroelectric memory cells are characterized via a hysteresis loop as illustrated in FIG. 1. FIG. 1 illustrates a dashed line which is a hysteresis loop extending from −5 volts to 5 volts. When the two capacitor electrodes of the ferroelectric capacitor are biased to a differential voltage of +5 volts, a positive charge is stored into the capacitor. If this voltage is then removed from 5 volts to 0 volts, the capacitor retains a positive charge or polarity as indicated in a top portion of FIG. 1 when the voltage is zero. If the voltage across the ferroelectric capacitor is pushed to −5 volts and then released to 0 volts, the charge stored in the ferroelectric device will be negative as indicated via a bottom portion of the polarization axis in FIG. 1 when voltage is zero. Therefore, the ferroelectric dielectric between the two conductive capacitor electrodes may be programmed into one of two states (a logic zero and a logic one) depending upon a previously applied voltage (either +5 v or −5 v).

These ferroelectric memory cells are advantageous since they have a small cell surface area in a manner similar to a DRAM, require no refreshing circuitry as does a DRAM, are non-volatile and will not lose charge or data when power is turned off as does a DRAM, are more radiation hard and have reduced soft error rate when compared to DRAMs, and have other advantages over DRAM cells and other like memory cell structures. However, ferroelectric cells have not been widely integrated into existing integrated circuit designs or into existing computer designs partly for the reason that simulation and design of these ferroelectric circuits are either inadequate or difficult to implement. A circuit designer cannot design a ferroelectric capacitor into a process flow and integrated circuit layout if the ferroelectric cell cannot be properly modeled while in the design phase.

FIG. 1 illustrates a prior art method of modeling a hysteresis loop referred to as the Miller model. The Miller model fits the major hysteresis loop indicated in FIG. 1 by the dashed line, and all minor internal hysteresis loops in FIG. 1 using an equation $P=P_0 \times \tanh(F(V))+C_0 \times V$, where $P$=polarization, $P_0$=maximal polarization, $F(V)$ is some function of voltage, $C_0$=capacitance, and $V$=the operating voltage of the model. FIG. 1 illustrates that when using this hyperbolic tangent model, loop walking 10 can occur where the loop walking is highly inaccurate to actual physical operation. To illustrate the loop walking phenomenon, assume that the capacitor which results in the hysteresis curve of FIG. 1 is charged to 5 volts. After being exposed to 5 volts, the voltage is dropped to 0 and then the voltage is subsequently oscillated between −0.3 volts and +0.3 volts as illustrated in FIG. 1. Using the Miller model, instead of the model retaining charge for the small sinusoidal −0.3 volts to +0.3 volts oscillation, the Miller model will decay the charge or walk the minor hysteresis loops towards zero polarization as indicated in FIG. 1. This is physically incorrect since the ferroelectric cell should maintain a small hysteresis loop in the vicinity of the current polarization without polarization falling to zero over time. In addition, the curve 10 is not even in the shape of a minor hysteresis loop which is also a fatal flaw of the model.

Therefore, any complicated voltage function applied to a ferroelectric capacitor over time cannot be modeled by the Miller model. This loop walking and minor loop shape distortion which results from the Miller model results in the Miller model not being effective for ferroelectric circuit design. In essence, any design cycle using the Miller model is time inefficient and ineffective and may result in a manufactured part that does not yield properly unless the design process is iterated many times.

FIG. 2 illustrates another hysteresis curve which is similar to the hysteresis curve illustrated in FIG. 1. FIG. 2 is used to illustrate that linear interpolations or linear approximations are used by circuit designers to model hysteresis curves for ferroelectric capacitors. Instead of closely following the curvature and shape and the hysteresis curve, the linear model assumes that there is a straight line between a maximum voltage/charge point on the upper right hand corner of the hysteresis curve and at zero voltage programmed point which results in either a binary zero value or a binary one value depending upon the resulting polarization. Although this model allows for very rough estimation of the functionality of a ferroelectric capacitor, it is inadequate to form complicated ferroelectric circuits and precise ferroelectric models so that ferroelectric circuits can be manufactured with high yield and in a time efficient manner. In general, the linear approach to modeling any non-linear electrical device, while simple and easy to calculate, is usually always inadequate and results in erroneous manufacture and faulty operation of integrated circuit devices. Therefore, a non-linear device designed and manufactured using a linear model will most likely not work when first manufactured and will have to be iteratively manufactured many times resulting in wasted time and wasted money in order to optimize the design for real world conditions.

Another method used in the prior art is a Gaussian surface integral model developed by Zurcher et al. This model is illustrated in FIG. 3 herein. FIG. 3 illustrates that a ferroelectric capacitor, when designed into an integrated circuit, comprises a ferroelectric capacitor portion and a load/bit line capacitor portion. These capacitor portions may be spliced into a plurality of infinitesimal or thin Gaussian surfaces which can each be characterized by a plurality of parameters such as dielectric constants, E-field, thickness of layer, coercive field, and spontaneous polarization, etc. This model is computationally intensive and parameterization of the model is incredibly difficult. This model requires solving large matrices many times (1000–3000 times) and requires several (50–100) parameters stored in memory at any given time. When simulating the circuit, the voltage across the ferroelectric model will change often and every incremental voltage across the capacitor will require the Zurcher model to calculate hundreds if not thousands of computations in order to correct the model to provide for a correct charge in the capacitor in response to the changing voltage. Because of the computationally intensive operation, it is impossible for the Zurcher model to be used in a time efficient manner within an actual circuit simulator since simulation times would be significantly increased by using the Zurcher model to the point where the circuit designer could not feasibly iterate multiple designs and solve problems using this time consuming simulation model. One can easily appreciate the time consuming calculation intensive nature of the Zurcher model by observing the resulting Zurcher equations below for only seven Gaussian surfaces:

$$\begin{pmatrix} -1 & \epsilon_0\epsilon_1 & 0 & 0 & 0 & 0 & 0 & 0 & 0 \\ -1 & 0 & \epsilon_0\epsilon_2 & 0 & 0 & 0 & 0 & 0 & 0 \\ -1 & 0 & 0 & \epsilon_0\epsilon_3 & 0 & 0 & 0 & 0 & 0 \\ -1 & 0 & 0 & 0 & \epsilon_0\epsilon_4 & 0 & 0 & 0 & 0 \\ -1 & 0 & 0 & 0 & 0 & \epsilon_0\epsilon_5 & 0 & 0 & 0 \\ -1 & 0 & 0 & 0 & 0 & 0 & \epsilon_0\epsilon_6 & 0 & 0 \\ -1 & 0 & 0 & 0 & 0 & 0 & 0 & \epsilon_0\epsilon_7 & 0 \\ -1 & 0 & 0 & 0 & 0 & 0 & 0 & 0 & \epsilon_0\epsilon_l \\ 0 & d_1 & d_2 & d_3 & d_4 & d_5 & d_6 & d_7 & d_l \end{pmatrix} \times \begin{pmatrix} \sigma \\ E_1 \\ E_2 \\ E_3 \\ E_4 \\ E_5 \\ E_6 \\ E_7 \\ E_l \end{pmatrix} = \begin{pmatrix} Q_{f_1} \\ Q_{f_2} - P_{s_2} \\ Q_{f_3} - P_{s_3} \\ Q_{f_4} - P_{s_4} \\ Q_{f_5} - P_{s_5} \\ Q_{f_6} - P_{s_6} \\ Q_{f_7} \\ Q_{f_l} \\ -V_{bias} \end{pmatrix}$$

It is apparent that the Miller model, linear model, and Zurcher model, which are either used for the design of ferroelectric circuits or are being considered for use in designing ferroelectric circuits, are inadequate for designing ferroelectric devices in a time efficient and cost effective manner. The need exists in the art for an improved ferroelectric model which does not loop walk or have shape incorrectness as does the Miller model, which is more accurate than the linear approximations used in the past, and is less computationally intensive than the Zurcher model, while being computationally manageable, accurate, and time/cost effective.

Figure 1:
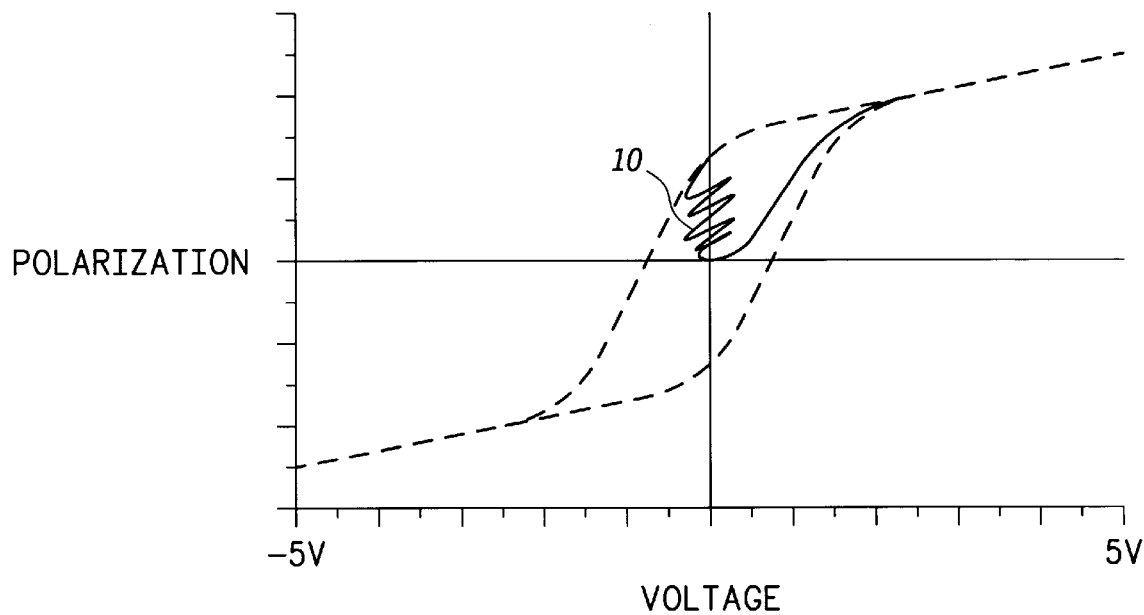
FIG. 1 illustrates, in an X-Y plot, a first prior art ferroelectric modeling technique which has loop walking problems and minor hysteresis loop shape incorrectness.

It will be appreciated that for simplicity and clarity of illustration, elements illustrated in the FIGURES have not necessarily been drawn to scale. For example, the dimensions of some of the elements are exaggerated relative to other elements for clarity. Further, where considered appropriate, reference numerals have been repeated among the FIGURES to indicate corresponding or analogous elements.

DESCRIPTION OF A PREFERRED EMBODIMENT

Figure 4:
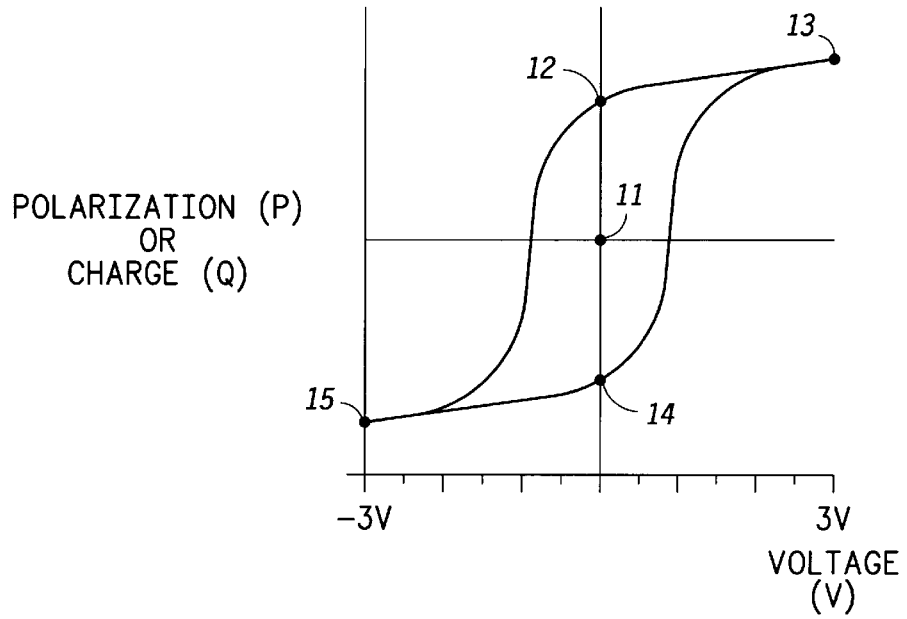
FIG. 4 illustrates, in an X-Y plot, a hysteresis loop for a ferroelectric capacitor designed in accordance with the present invention.

FIG. 4 illustrates a hysteresis curve along a voltage X-axis and a polarization or charge stored Y-axis. For the ferroelectric cell, the ferroelectric cell receives a maximum voltage of 3 volts and a minimum voltage of −3 volts. When the ferroelectric capacitor is exposed to a 3 volt differential and then the 3 volt differential is dropped to 0 volts, the resulting quiescent point 12 is the charge that results in the ferroelectric capacitor. When the voltage across the capacitor is driven to −3 volts, the ferroelectric capacitor when reduced to 0 volts will arrive at the quiescent operating point 14 and store a negative charge, as illustrated in FIG. 4. In most cases, the point 12 indicates a logic 0 and the point 14 indicates a logic 1. However, there is nothing stopping a circuit designer from designing a ferroelectric memory cell such that the point 12 is a logic 1 and the point 14 is a logic 0. The choice between logic 1 and 0 is one of active high versus active low and is design choice.

Figure 5:
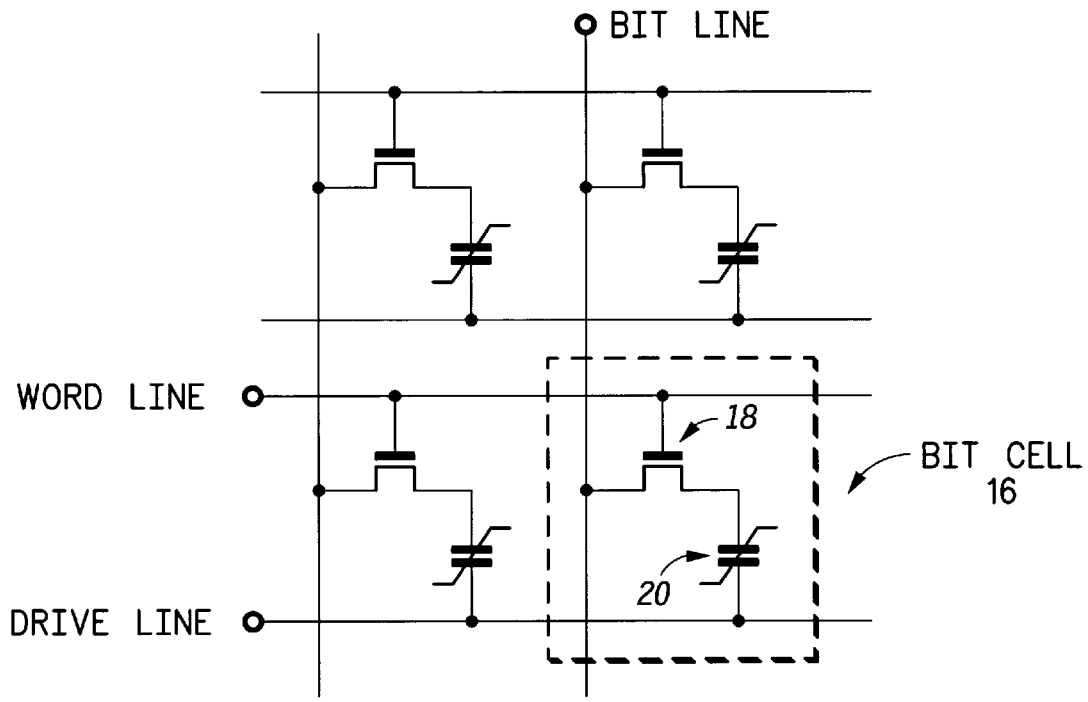
FIG. 5 illustrates, in a circuit schematic, a portion of a ferroelectric memory array designed in accordance with the present invention.

FIG. 5 illustrates four bit cells and their circuit configuration as they would be formed on a semiconductor substrate. FIG. 5 illustrates a specific bit cell 16. Bit cell 16 contains a transistor 18. Transistor 18 is an MOS transistor that has a gate electrode coupled to word line and a drain electrode coupled to a bit line. A source/drain electrode of the transistor 18 is coupled to ferroelectric capacitor 20 in FIG. 5. A second terminal of the ferroelectric capacitor 20 is coupled to a drive line as illustrated in FIG. 5. Data values are read to and from the bit cell 16 via the bit line, while the word line controls access to the charge stored in ferroelectric capacitor 20. The drive line, which is usually grounded in a DRAM configuration, is instead coupled to drive circuitry that allows the drive line to be biased at either 3 volts or 0 volts. This biasing of the drive line is required in order for the bit line to be set low and the drive line to be set at 3 volts to arrive at a 3 volt potential across the ferroelectric capacitor and in order for the bit line to be set high (+3 volts) and the drive line to be set low (0 volts) to arrive at a negative potential across the ferroelectric capacitor. If the drive line were to be grounded, which is possible in some designs, in order to get both the 3 volt and a −3 volt polarity across the capacitor 20 one must be able to drive the bit line to both −3 volts and +3 volts. Therefore, the bit line in this circumstance must comprise bipolar driver circuitry. To avoid this bipolar drive circuitry and utilize only a 3 volt power supply and a ground power supply, the drive line is designed such that it is capable of being driven to ground or to 3 volts to effect a negative or positive potential across the capacitor 20. Although the above example uses +/−3 volts, any voltage scheme may be used.

Figure 6:
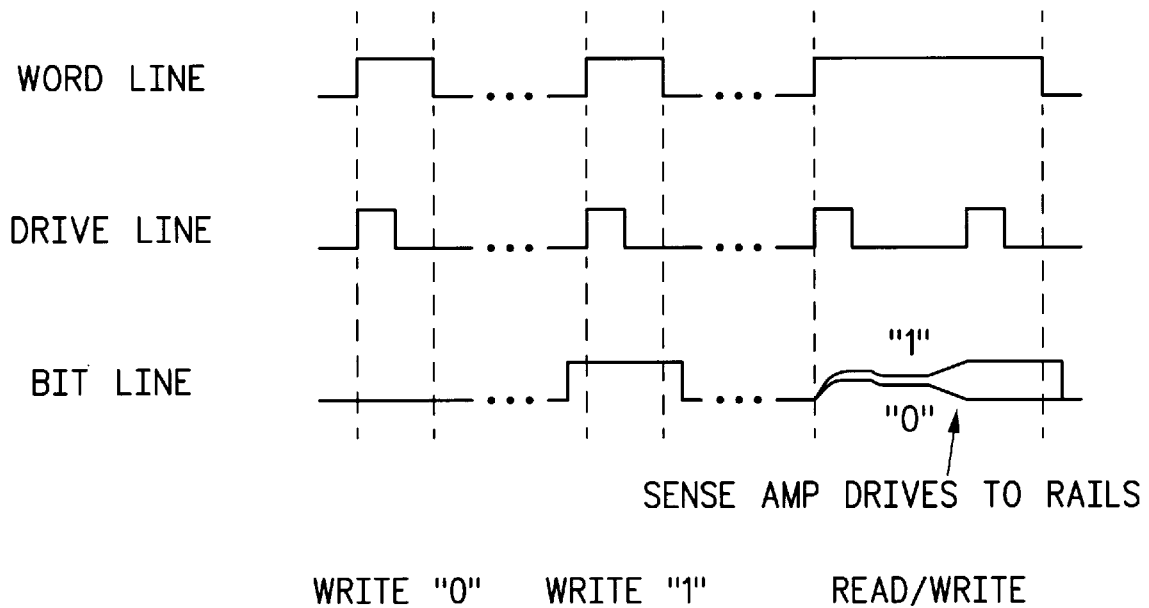
FIG. 6 illustrates, in a timing diagram, a write logic zero operation, a write logic one operation, and a memory read operation for any memory cell of FIG. 5.

FIG. 6 illustrates a timing diagram wherein a first one-third of the timing diagram illustrates a write operation wherein a logic 0 is written to the capacitor 20 of FIG. 5. A middle portion of FIG. 6 illustrates a process used to write a logic 1 to the capacitor 20 of FIG. 5. A right-most portion of FIG. 6 illustrates how a read operation is performed to read the logical value stored in the capacitor 20.

In order to write a logic 0, the word line is set to a logic 1 (i.e., 3 volts). In addition, the drive line is pulsed to 3 volts or a logic 1 and then dropped to a logic 0. The bit line remains grounded at 0 volts. When the drive line is at 3 volts and the bit line is at 0 volts, a +3 volt potential is placed across the capacitor 20 in FIG. 5 and the ferroelectric capacitor is biased to point 13 in FIG. 4. Once the voltages are removed and the word line, drive line and bit line all become 0 volts, the capacitor 20 will arrive at the quiescent point 12 of FIG. 4 and store a logic 0.

In order to write a logic 1 via a mid portion of FIG. 6, the word line is driven to 3 volts, the drive line is driven to 3 volts followed by a drive to ground and the bit line is driven to 3 volts or a logic 1. When the bit line and the drive line are both at 3 volts, the potential difference across the ferroelectric capacitor is maintained at 0 volts. However, when the drive line falls to 0 volts while the bit line is at 3 volts, a −3 volt potential is placed across the ferroelectric capacitor 20 of FIG. 5 resulting in the ferroelectric capacitor being driven to point 15 of FIG. 4. Once the bit line is returned to ground potential, the ferroelectric capacitor 20 of FIG. 5 arrives at the quiescent point 14 of FIG. 4, thereby storing a logic 1 value.

When reading a value stored from the ferroelectric capacitor of FIG. 5, the word line is driven to 3 volts and the drive line is pulsed for a short period of time to 3 volts. When the drive line is pulsed to 3 volts, if the capacitor is at quiescent point 12, a small amount of current will be placed onto the bit line since the difference between point 13 and point 12 in terms of charge is small. However, if the operating point of the capacitor 20 is point 14 of FIG. 4, then a large current will be sensed on the bit line since the charge difference between point 13 and point 14 is larger than the difference between point 13 and point 12. Therefore, by sensing current flow or a voltage difference on the bit line as a function of the current, a sense circuitry coupled to the bit line can determine whether a logic 0 or a logic 1 is stored in the ferroelectric capacitor 20. However, the step of reading will inherently destroy the logic value stored in the ferroelectric capacitor 20. Therefore, every read operation must be followed with a re-write operation wherein the value previously stored in the ferroelectric capacitor is re-written to the ferroelectric capacitor 20 as illustrated in FIG. 6. This re-write procedure directly following a read is needed to restore the charge in the capacitor 20 to the state it was maintaining before the read operation occurred. This type of a re-write operation is similar to the re-write performed in a DRAM circuit.

Figure 7:
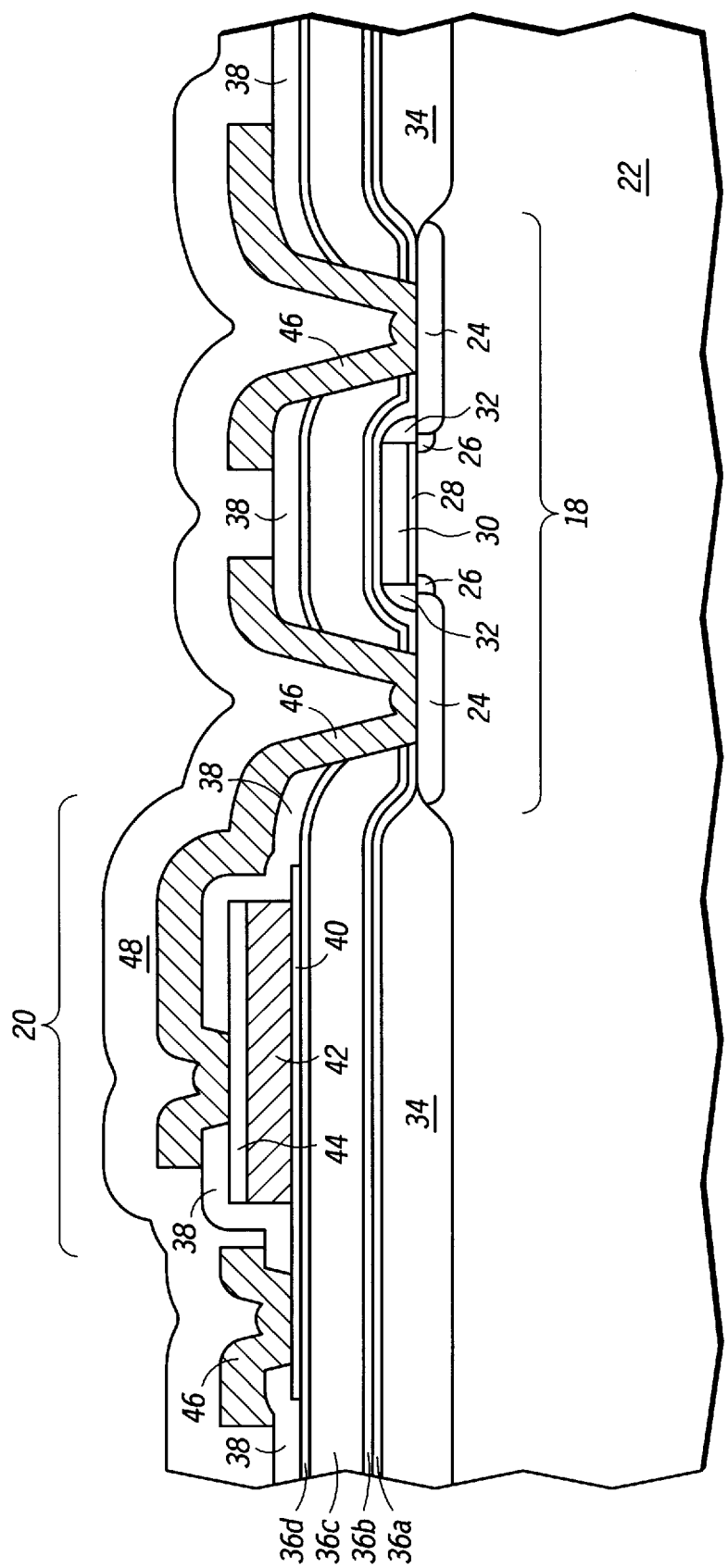
FIGS. 7–8 illustrate, in cross-sectional diagrams, ferroelectric capacitors in accordance with the present invention.

FIG. 7 illustrates a cross-sectional view of a ferroelectric bit cell illustrated in FIG. 5. FIG. 7 illustrates the transistor 18 of FIG. 5 and the bit cell capacitor 20 of FIG. 5. In FIG. 7, a P-type silicon substrate 22 is provided. Using a nitride mask layer to reduce birds-beak effects, a thick field isolation region 34 is formed by growing thermal oxide to a silicon dioxide thickness of roughly 4,000 angstroms to 8,000 angstroms. It is important to note that other isolation schemes such as trench isolation, polysilicon buffered local oxidation of silicon (PBL), etc., can be used. A gate dielectric layer 28 is formed wherein the gate dielectric layer is typically between 30 angstroms and 120 angstroms in thickness and comprises either thermally grown silicon dioxide or some composite dielectric comprising deposited tetraethylorthosilicate (TEOS) and a thermal oxide portion with an optional nitrided or fluorinated interface.

A polysilicon layer is deposited and patterned to form a polysilicon gate electrode 30 as illustrated in FIG. 7. A self-aligned LDD (lightly doped drain) implant 26 is then performed where the region 26 is a lightly doped N− region and is self-aligned to a sidewall of the polysilicon layer 30. A dielectric layer is then deposited and RIE etched to form a dielectric spacer 32 which is usually either silicon nitride or silicon dioxide. This spacer 32 is then used to self-align N+ implants 24 to complete formation of the source and drain of the transistor 18. The ion implantation step used to form the N+ regions 24 are then followed by various deposition steps wherein a TEOS layer is deposited as a dielectric layer 36a. This TEOS layer 36a is typically 100 nanometers in thickness. This TEOS layer 36a is optional. A thin silicon nitride layer 36b is then deposited. This silicon nitride layer 36b is typically 45 nanometers in thickness and this layer 36b is deposited on top of the TEOS layer 36a. A thick borophosphosilicate glass (BPSG) layer 36c is formed overlying the silicon nitride layer. This BPSG layer is typically 600 nanometers in thickness and may be optionally reflowed via thermal processing or a rapid thermal processing (RTP) method. A thin layer of TEOS, which is typically 150 nanometers, is then deposited on top of the BPSG as illustrated by TEOS dielectric layer 36d.

After formation of the dielectric layers 36a–36d, a conductive layer is deposited and patterned to form the first electrode of the ferroelectric capacitor referred to in FIG. 7 as electrode 40. The electrode 40 is typically made of a conductive material such as platinum, ruthenium, ruthenium oxide, or a like conductive layer that does not adversely effect ferroelectric materials. Glue layers such as titanium oxide or titanium may be used when forming electrodes. A ferroelectric material is then deposited followed by the deposition of a second conductive layer of material which is similar to the material used to form electrode 40. The ferroelectric material and the overlying conductive material are patterned and etched via a simultaneous step to form both a self-aligned second electrode labeled as electrode 44 and a self-aligned ferroelectric capacitor dielectric region 42. Typically, the ferroelectric region is formed comprising one or more layers of lead zirconate titanate (PZT), lead niobium zirconate titanate, lead niobium lanthanum zirconate titanate, barium titanate, calcium titanate, bismuth titanate, strontium titanate, lead zirconate, lead lanthanum zironate titanate, strontium bismuth tantalum oxide (Y1), strontium bismuth niobate, strontium bismuth niobate tantalate, and/or lead titanate, either alone or in any combination. The second capacitor electrode 44 is similar in material to the electrode 40.

An insulating dielectric layer 38 is deposited overlying the ferroelectric capacitor comprising electrodes 40 and 44 and dielectric 42. Openings are then etched through the dielectric layer 38 and the dielectric layers 36a through 36d to expose the source and drain 24, the electrode 44, and a contact portion of the electrode 40 as illustrated in FIG. 7. A conductive metal layer which is typically an aluminum-silicon-copper 98%-1%-1% mixture is deposited and patterned to form contacts 46. A titanium/TiN barrier is typically formed beneath the aluminum interconnect 46 as a diffusion barrier layer. A top level passivation layer 48 is deposited on top of the aluminum of layer 46 to passivate the entire circuitry. Therefore, FIG. 7 illustrates the formation of an entire ferroelectric cell, from a cross-sectional perspective.

Figure 8:
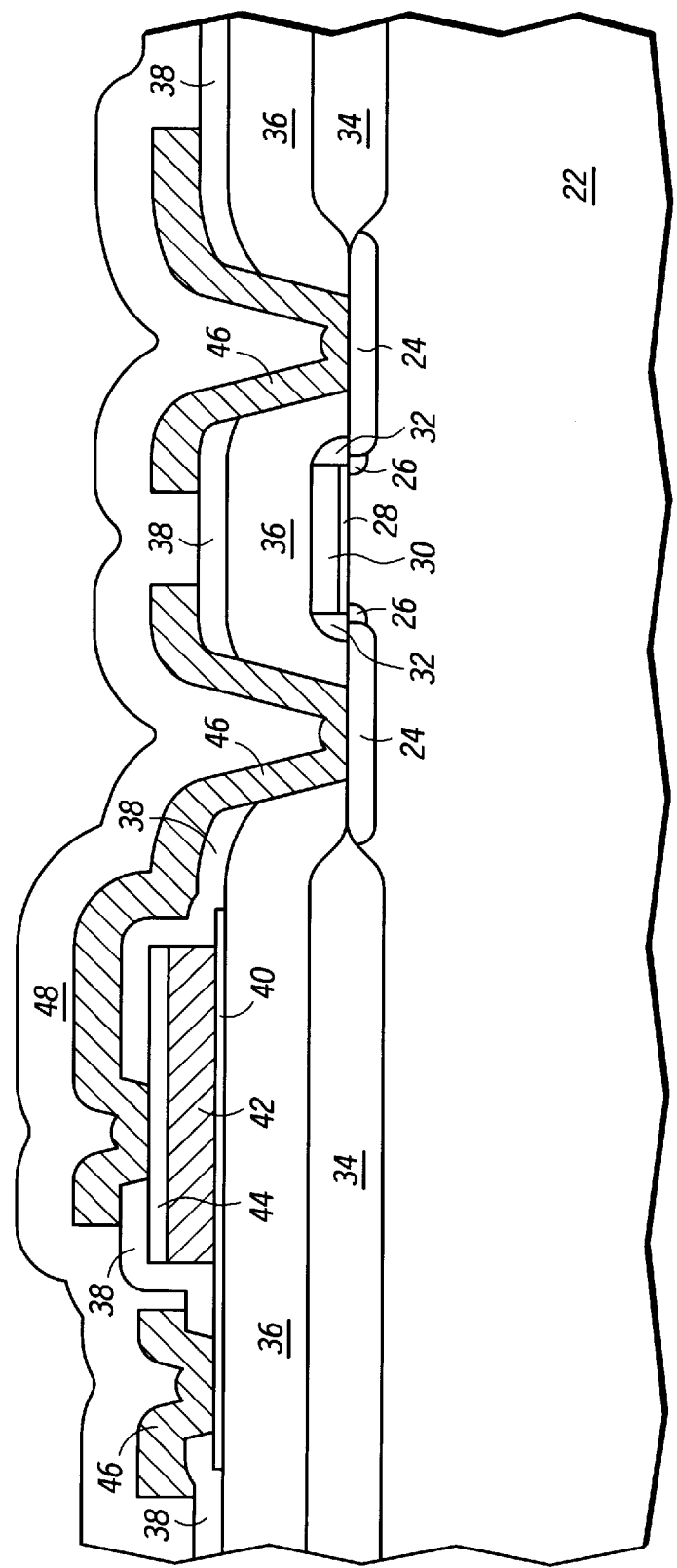

FIG. 8 illustrates a ferroelectric cell similar to that illustrated in FIG. 7. However, FIG. 8 illustrates an inter-layer dielectric 36 which is not a composite dielectric as illustrated in FIG. 7. In addition, in FIG. 8, the ferroelectric material 42 is patterned and etched via a photolithographic/etch step that is separate from the patterning and etching of layer 44. Therefore, the ferroelectric storage cell illustrated in FIG. 8 is typically referred to as a triple tier structure ("wedding cake") ferroelectric configuration. A wedding cake configuration is when the upper electrode 44 and the ferroelectric 42 are not self-aligned to one another and are instead formed by separate steps of photolithographic patterning and etching.

Figure 2:
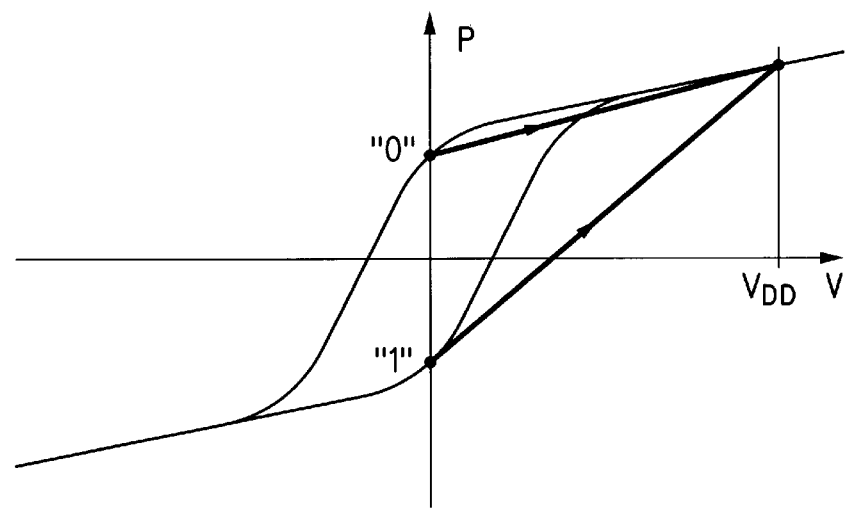
FIG. 2 illustrates, in an X-Y plot, a second prior art ferroelectric modeling technique which is fundamentally inaccurate.
Figure 3:
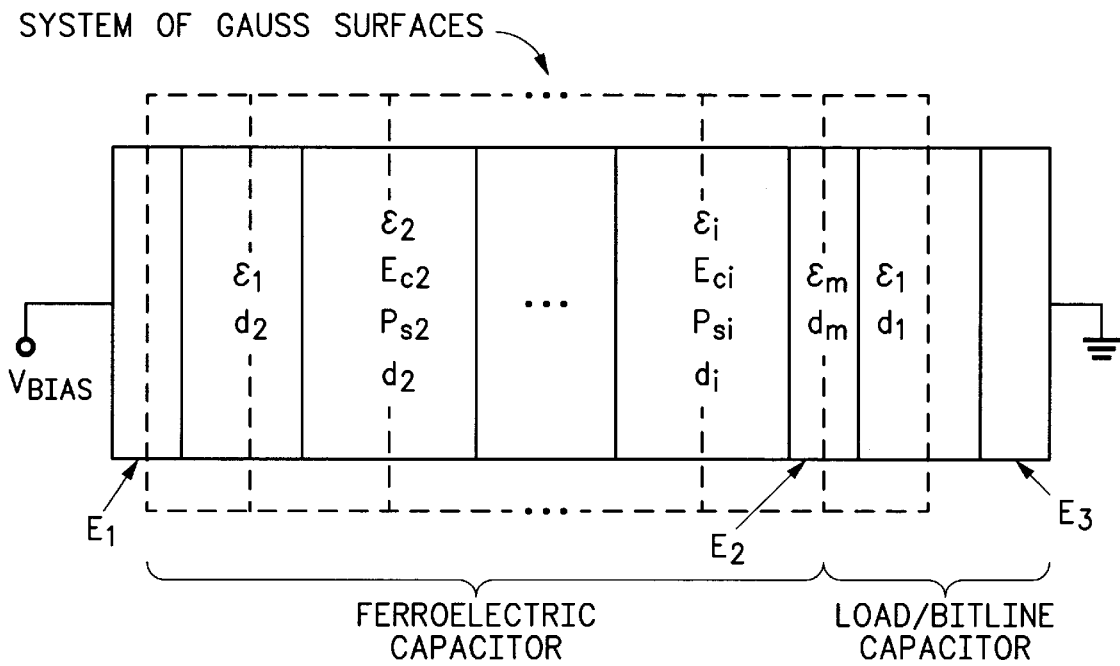
FIG. 3 illustrates, in a capacitor cross sectional diagram, a third prior art ferroelectric modeling technique which is too computationally intensive for actual simulator use.

It is difficult to model a ferroelectric capacitor as a circuit element because its behavior depends on its entire history prior to the current time of interest. In the following figures and paragraphs, a simulation technique for simulating the ferroelectric characteristics, ferroelectric circuits, and ferroelectric devices of FIGS. 4–8 is taught where this simulation technique is superior to the simulation techniques illustrated in FIGS. 1–3. In the simulated ferroelectric model below, the model keeps track of past history of the ferroelectric capacitor by storing charge voltage points in a data file in memory when local extrema in voltage versus time are detected. In other words, a history table is kept in memory which stores the N turning points or transition points (N being a finite positive integer) of the hysteresis loops of the ferroelectric model as the model is exercised by a voltage function over time. For example, FIGS. 11–17 illustrate turning points 1 through 8 which are stored in memory.

Removal of unnecessary and unneeded voltage/charge (V,Q) data points from the history table is performed in order to manage a small history data base which is quick and efficient. Therefore, the model taught below is computationally quick and capable of real-time simulation while being extremely accurate. Ferroelectric parameters of the model taught below are adjusted according to an operational temperature so that ferroelectric devices can be simulated at any operational temperature. A temperature adjustment preferably used is a polynomial adjustment wherein temperature critical parameters (X) of the ferroelectric model which are default provided at a predetermined temperature (room temperature preferably) are altered by the equation:

$$X(T) = X_o(1 + c_1(\Delta T) + c_2(\Delta T)^2) \quad (eq.\ 1)$$

where
$X_o$=the default room temp. parameter
$c_1$=a polynomial constant from memory
$c_2$=a polynomial constant from memory It is important to note that other temperature adjustment functions, such as exponential functions, may be used instead of the polynomial approach indicated above.

A good ferroelectric capacitor model should satisfy several physical requirements often observed in a manufactured ferroelectric capacitor. A first physical requirement is that regardless of the previous history of the capacitor, the polarization and E field must always lie on or within the saturated polarization loop or outer hysteresis loop of the ferroelectric device. In addition, the magnitude of a derivative of the polarization (dP/dE) at any given E field and polarization must be no greater than that of the saturated loop. The model taught herein assumes that the ferroelectric hysteresis of the capacitor has non-local memory. Therefore, the ferroelectric capacitor may have many possible quiescent states (Q state) at a specific input voltage and that Q state would depend on the electrical stimulation experienced at previous times in the simulation. For example, when the voltage across the ferroelectric capacitor is zero volts, any one of a plurality of charge points between the points 12 and 14 of FIG. 4 may be resulting in the ferroelectric capacitor depending upon a past history of voltage excitation across the ferroelectric capacitor during previous simulation times. Experimental observation of ferroelectric capacitors indicate that ferroelectric capacitors incorporate non-local memory and should be modeled by the model taught herein and not the Miller model taught via FIG. 1.

In models such as the Miller model, the hyperbolic tangent function is used to curve fit saturated loops or major hysteresis loops of ferroelectric capacitors. The equation is given below:

$$Q = Q_0 \cdot \tan h(a(V-V_c)) + C_l V \quad (eq.\ 2)$$

where:
V=the voltage from the voltage/charge point $V_c$=an initial coercive voltage parameter from memory, where Vc is positive when V is increasing and Vc is negative when V is decreasing $Q_0$=an initial saturated ferroelectric charge parameter from memory $C_l$=an initial non-ferroelectric capacitor charge paraneter from memory a=a curve shaping parameter read from memory.

This hyperbolic tangent function of eq. 2 is a reasonable fit of the major loops or outer loops of ferroelectric devices but does not work properly for simulating inner or minor loops of a hysteresis curve as is evident given the Miller model which lacks history. In the model taught below, minor loops are mathematically curve fitted using a hybrid hyperbolic tangent function which comprises exponential terms:

$$Q = Q_0 \frac{\alpha \cdot \exp(a(V - V_c)) - \beta \cdot \exp(-a(V - V_c))}{\exp(-a(V - V_c)) + \exp(a(V - V_c))} \quad (eq.\ 3)$$

where:
V=the voltage from the voltage/charge point
$V_c$=an initial coercive voltage parameter from memory, positive when V is increasing and negative when V is decreasing $Q_0$=an initial saturated ferroelectric charge parameter from memory $C_l$=an initial non-ferroelectric capacitor capacitance parameter from memory a=a curve shaping parameter read from memory
$\alpha$=a value between 0 and 1
$\beta$=a value between 0 and 1

Eq. 3 is used to calculate the charge across the ferroelectric capacitor as the voltage changes. The parameters $\alpha$ and $\beta$ are calculated using the turning points in the history data file with the following equations:

$$\alpha = \frac{b_2 A - a_2 B}{a_1 b_2 - a_2 b_1} \quad \text{(eq. 4)}$$

$$\beta = \frac{b_1 A - a_1 B}{a_1 b_2 - a_2 b_1} \quad \text{(eq. 5)}$$

wherein:

$$a_1 = Q_0 \exp(a(V_1 - V_c)) \quad \text{(eq. 6)}$$

$$a_2 = Q_0 \exp(-a(V_1 - V_c)) \quad \text{(eq. 7)}$$

$$b_1 = Q_0 \exp(a(V_2 - V_c)) \quad \text{(eq. 8)}$$

$$b_2 = Q_0 \exp(-a(V_2 - V_c)) \quad \text{(eq. 9)}$$

$$A = (Q_1 - C_f V_1)(\exp(a(V_1 - V_c)) + \exp(-a(V_1 - Vc))) \quad \text{(eq. 10)}$$

$$B = (Q_2 - C_f V_2)(\exp(a(V_2 - V_c)) + \exp(-a(V_2 - V_c))) \quad \text{(eq. 11)}$$

In the above equations, two history turning points from the data history file are used. These two turning points are voltage/charge points $(V_1, Q_1)$ and $(V_2, Q_2)$. The turning point $(V_1, Q_1)$ in the above equations is the turning point most recently stored in time in the history data file. If $(V_1, Q_1)$ is a local voltage maximum which is referred to as a positive turning point, then $(V_2, Q_2)$ is the adjacent local voltage minimum which is referred to as a negative turning point to $(V_1, Q_1)$ in the history data file. Likewise, if $(V_1, Q_1)$ is a negative turning point, then $(V_2, Q_2)$ is the adjacent positive turning point to $(V_1, Q_1)$ in the history data file. It is important to note that a positive turning point may contain a negative voltage value and a negative turning point may contain a positive voltage value under certain conditions. In some circumstances, when the model voltage goes beyond the turning point $(V_2, Q_2)$, $(V_2, Q_2)$ becomes $(V_1, Q_1)$ and a next turning point adjacent to the old $(V_2, Q_2)$ point which is older in history than the old $(V_2, Q_2)$ point becomes the new $(V_2, Q_2)$ point wherein the old and new $(V_2, Q_2)$ points are either both positive turning points or negative turning points. Once the points $(V_2, Q_2)$ and $(V_1, Q_1)$ change for any reason, $\alpha$ and $\beta$ are recalculated as taught above. For a more detailed description regarding the use of the turning points in the above equations, see the example in FIGS. 11–17. In addition, a Vca parameter can be incorporated into the above equations by replacing Vc with (Vc+/−Vca). The Vca parameter accommodates shift in the hysteresis curve with respect to the voltage axis.

Figure 9:
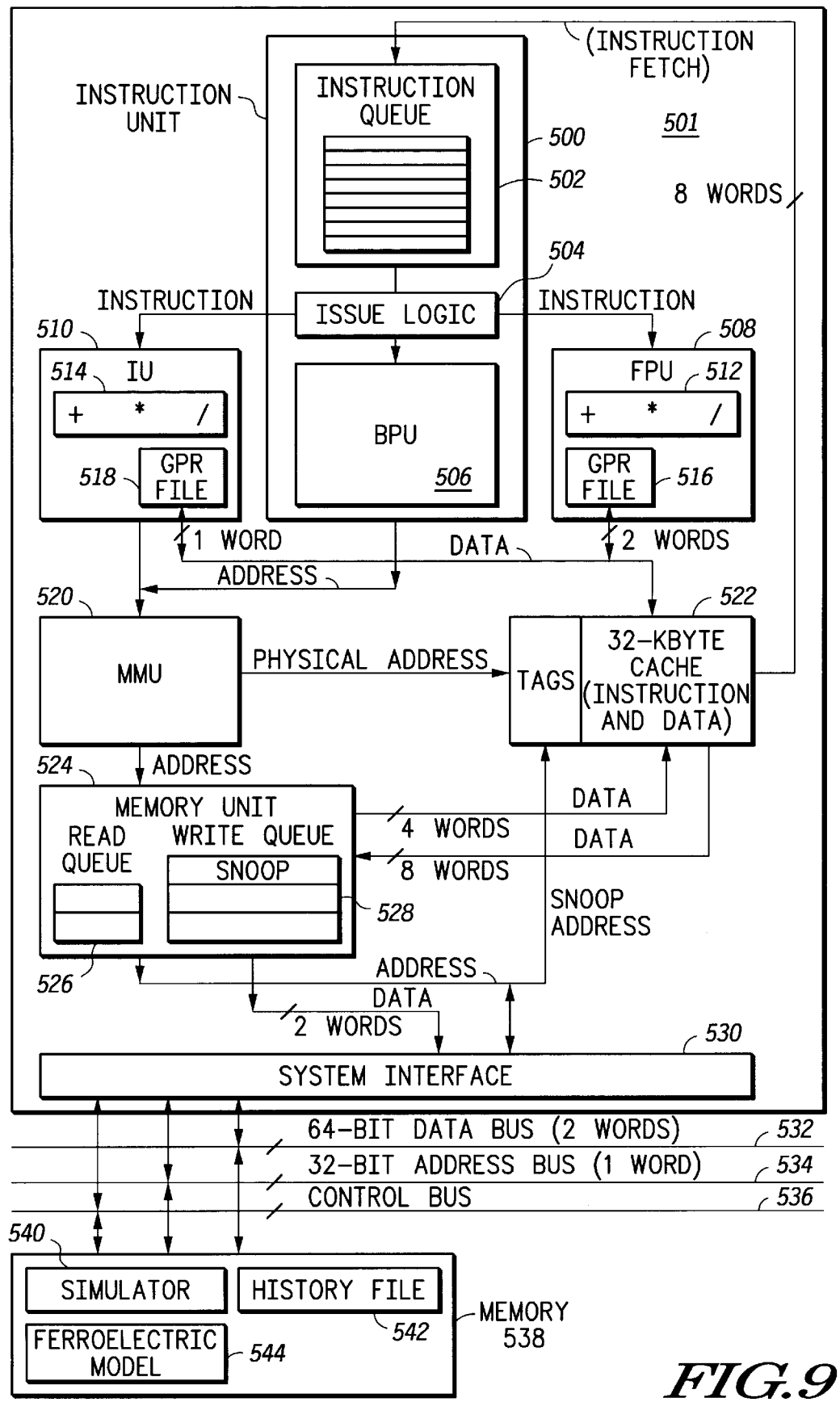
FIG. 9 illustrates, in a block diagram, a data processing system used to simulate ferroelectric devices in accordance with the present invention.

FIG. 9 illustrates a data processing system for performing the ferroelectric modeling discussed herein. FIG. 9 illustrates a data processor 501. Data processor 501 has an instruction unit 500 which contains a plurality of instruction queues 502. The instruction unit 500 receives computer instructions from a memory 538 in FIG. 9 and stores these instructions in an instruction queue 502. Instructions are then selected from the instruction queue 502 via issue logic 504. The instructions may be selected in order or out of programmed order depending on the particular architecture of data processor 501. The issue logic 504 then determines whether the instruction fetch from the queue 502 is a branch instruction, an integer instruction, or a floating point instruction. Depending on the type of instruction detected by the issue logic 504, the instruction is dispatched to one of either an integer unit 510, a branch prediction unit 506, or a floating point unit 508. Therefore, processor 501 is a superscalar architecture capable of concurrently processing up to three operations as one time.

The integer unit 510 is used to perform integer math operations and has circuitry to perform addition, multiplication, subtraction, and division operations via logic 514. A general purpose integer register file 518 is located within the integer unit 510 for storing data values on a temporary basis for use by the integrated unit 510. The branch prediction unit 506 is used to predict the direction of branches (e.g. either branch taken or branch not taken) and controls the execution flow of the computer instruction execution in an orderly manner. The floating point unit 508 is used to perform mathematical floating point operations via math circuitry 512. Floating point unit 508 contains a floating point general purpose register file 516 which contains floating point values for a transitory period of time for efficient access and use.

Data processor 501 contains a unified instruction and data cache 522 which stores tags and data/instruction information received from external memory 538. In a different architecture, a segmented instruction and data cache may replace the unified data cache 522 in FIG. 9. Cache 522 indicates that tag bits are stored which are used to identify various characteristics of the data stored in the cache. Data processor 501 contains a memory management unit 520 which is used to receive addressing information from the mathematical units 510, 506, and 508. Once receiving these logical addresses, the MMU 520 performs a logical to physical address translation and provides this physical address to both the cache 522 and the memory unit 524. If the memory location translated by the MMU 520 is found in the cache, the cache 522 is accessed to provide the data to the functional units 510, 506, and 508. If the data value is not located in the cache 522, then the memory unit 524 performs read or write operations through the system interface 530 to external memory 538 to access any data values that are needed by the units 510, 506, and 508. Therefore, the data processor 501 is one type of data processor which is used for executing computer instructions in order to simulate a ferroelectric capacitor as taught herein.

The data processor 501 interfaces to external memory via a 64-bit data bus 532, a 32-bit address bus 534, and a control bus 536. Through these buses, the data processor 501 can access and execute a ferroelectric simulator 540 stored in external memory 538. In a preferred embodiment, the simulator 540 is a SABER circuit simulator. FIG. 9 illustrates that the ferroelectric model 544 is also stored in external memory.

At the end of this specification, a code segment 2 is included. Code segment 2 is actual code which is contained within the saber simulator 540 to allow the data processor 501 to simulate a ferroelectric capacitor as taught herein. The specification below also contains a code segment 1 which is actual C code that defines the ferroelectric model taught herein which is used by the code segment 2 during simulation. Therefore, code segment 1 is the code contained in the ferroelectric model 544 of FIG. 9 and code segment 2 is at least a portion of the simulator 540 of FIG. 9. History data points or history turning points are stored in history file 542 for use by the ferroelectric model 544 and simulator 540. This history file 542 is needed to provide charge/voltage data points between which curve modeling algorithms (via eqs. 3 through 11) can be executed in order to accurately determine the charge stored in the ferroelectric capacitor as voltage across the ferroelectric capacitor is altered during simulation. The history data file and its contents are discussed in more detail in FIGS. 11–16.

Figure 10:
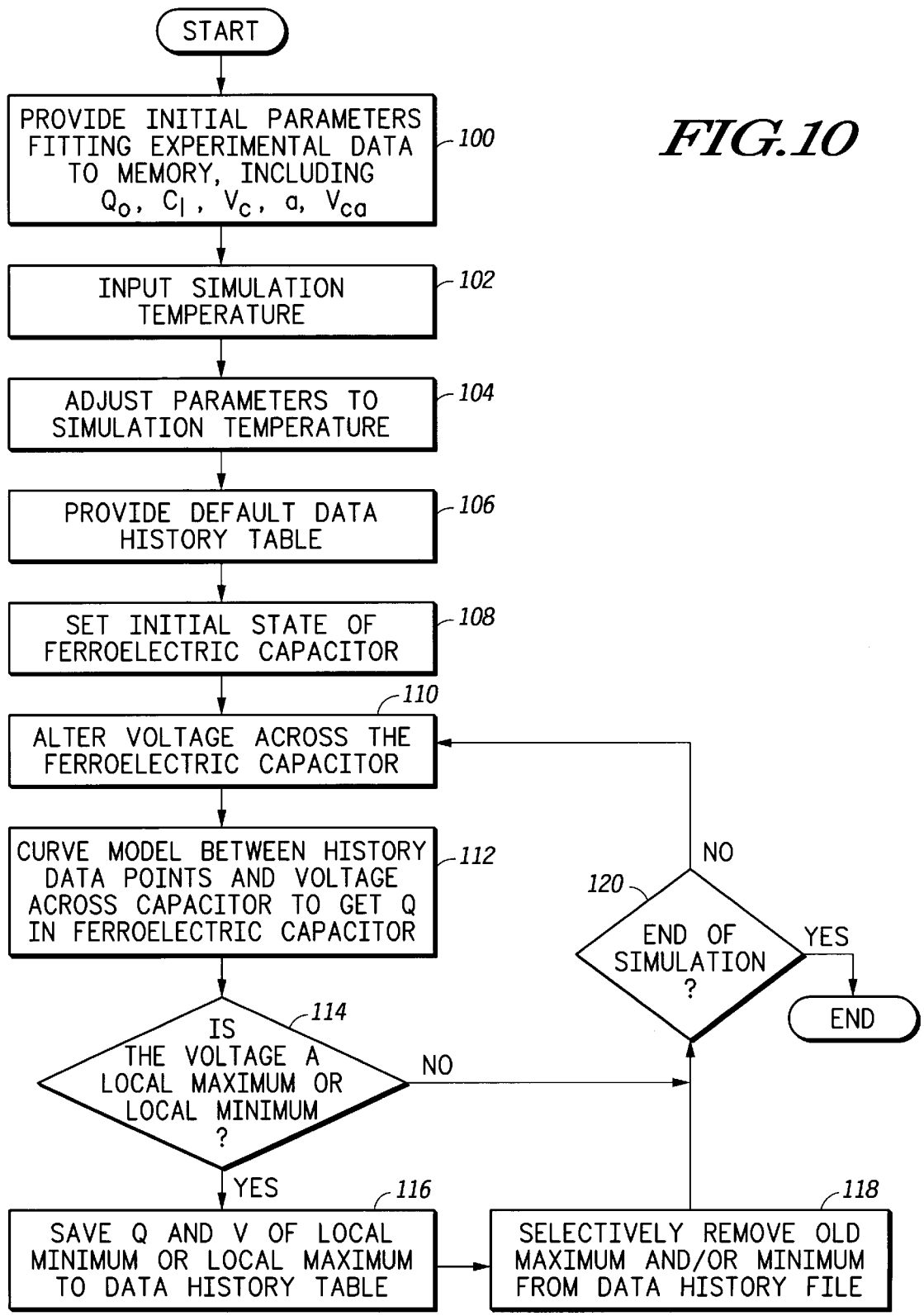
FIG. 10 illustrates, in a flowchart, a method for simulating a ferroelectric device in accordance with the present invention.

FIG. 10 illustrates a method used to simulate a ferroelectric capacitor using the system of FIG. 9. FIG. 10 begins with a step 100. In step 100, a plurality of initial ferroelectric capacitor parameters are provided from memory. The parameters used for simulation of the ferroelectric in the code segments 1 and 2 below are as follows:

MODEL PARAMETERS

Materials and Capacitor Parameters as used in the code segments 1 and 2:

po Maximum Polarization of ferroelectric capacitor (Qo)

vc Coercive Voltage of Ferroelectric Capacitor (determines a width of the hysteresis curve measured along the V axis)

vca Asymmetry Parameter for Vc (shifts hysteresis curve along the V axis to compensate for charge permanently trapped in capacitor, etc.)

a Shaping Parameter for slopes of hysteresis curves cl Linear Capacitance (non-ferroelectric Q storage capability)

ic Initial Condition on ferroelectric capacitor (a history starting point)

esr Equivalent Series Resistance of ferroelectric capacitor rleak Parallel Leakage Resistance of the ferroelectric capacitor l Capacitor Length (used to determine capacitive area)

w Capacitor Width (used to determine capacitive area)

Temperature Parameters as used in the code segments 1 and 2:

tcpo1 Temperature Coefficient c1 of eq. 1 for po parameter tcpo2 Temperature Coefficient c2 of eq. 1 for po parameter tcvc1 Temperature Coefficient c1 of eq. 1 for vc parameter tcvc1 Temperature Coefficient c2 of eq. 1 for vc parameter tca1 Temperature Coefficient c1 of eq. 1 for shaping parameter a tca2 Temperature Coefficient c2 of eq. 1 for shaping parameter a tccl1 Temperature Coefficient c1 of eq. 1 for cl parameter tccl2 Temperature Coefficient c2 of eq. 1 for cl parameter tnom Parameter Extraction Temperature (typically room temperature)

Run Parameters as used in the code segments 1 and 2:

dpvb V-start for Generating a Depolarized Capacitor dpvs V-step for Generating a Depolarized Capacitor dvth Minimum V shift required to alter polarization vdot initial direction of voltage (positive-going or negative-going)

Post-Processing Information as used in the code segments 1 and 2:

v Voltage Across Capacitor vesr Voltage Across Equivalent Series Resistance vcap Voltage Across Ferroelectric Capacitor and Parallel Leakage Resistance h Charge per Unit Area on Cap from Non-linear Ferroelectric Component qf Charge on Cap from Nonlinear Ferroelectric Component ql Charge on Cap from Linear Component qt Total Charge on Capacitor iesr Current in Series Resistance ileak Current in Leakage Resistance The physical parameters po (Qo), vc (Vc), vca (Vca), cl (Cl), and a are initially determined by measuring, to saturation, manufactured ferroelectric devices and curve fitting these experimental results using eq. 3 with α and β are both set to 1.

The above parameters are provided at a default temperature (tnom) which is typically room temperature in the step 100. It is important to note that many other parameter schemes may be used other than those specified above, taught herein, and used in the code segments contained herein. The temperature coefficients provided above are used with the polynomial eq. 1 provided herein to adjust the ferroelectric model for operation at any temperature. Therefore, the ferroelectric model can be simulated at 200° C. or any other temperature as requested by a computer user. This input simulation temperature is entered in step 102.

In step 104, eq. 1 is used for each temperature critical parameter to adjust the room temperature default parameters to the operational temperature entered in step 102. If the simulation is to occur at room temperature, no temperature adjustment is needed in step 104.

In step 106, a default data history file is created. In one form, the default initialized data history file 542 of FIG. 9 can contain the endpoints of the outer hysteresis loop (e.g. points 13 and 15 of FIG. 4). In other words, the data history table may be initialized to contain two theoretical starting points wherein a first point is the charge contained at −Vsat volts (a negative saturated voltage used in the model) and a second point is a charge contained at +Vsat volts (a positive saturated voltage used in the model). −Vsat must be less than or equal to the most-negative voltage applied in the model. +Vsat must be greater than or equal to the most-positive voltage applied in the model. In another embodiment, no default turning points are placed into the history data file and instead, when operating in a region which is not bounded by turning points, assumptions related to α and β are made. In this case, if the voltage V is negative-going, β is set to one and eq. 3 is solved for α with V and Q in eq. 3 being set to the last turning point encountered. If the voltage V is negative-going, a is set to one and eq. 3 is solved for β with V and Q being set to the last turning point encountered. These two methods of initializing the history data file are equivalent and interchangeable. The rest of the text assumes that, in general, step 106 provides two default data points within the hysteresis characteristic of the ferroelectric capacitor to provide for initial Q/V curve modeling via eqs. 3–11 before the model has gained significant history data. In step 108, the initial state of the ferroelectric capacitor is set using various parameters taught herein and execution of code taught below. Typically, the initial state may be set to either a program logic 0 data point 12 as illustrated in FIG. 4 or a logic data point 1 illustrated in data point 14 in FIG. 4. Using the above methods, a starting point is chosen such that the starting point lies on the saturated loop. However, if additional history is provided in the data history file upon creation, any starting point such as zero voltage and zero charge (point 11 of FIG. 4), may be chosen as a starting point for the step 108. The step 108, therefore, sets the initial charge on the capacitor for a specific initial voltage.

Figure 11:
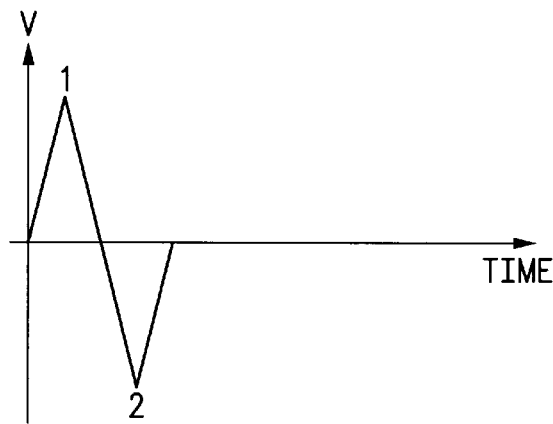
FIGS. 11–17 illustrate, in x-y plots, an example of storing history data in a history data file and using this history data for ferroelectric simulation in accordance with the present invention.

Simulation begins in step 110 wherein the voltage across the ferroelectric capacitor is altered by the simulator 540 of FIG. 9. In order to better describe FIG. 10, FIG. 10 will now be discussed with reference to the examples contained in FIGS. 11–17. The voltage which is altered over time as discussed in step 110 of FIG. 10 is illustrated in FIG. 11 for a first time period. FIG. 11 illustrates that the voltage is initially ramped up to a high voltage point 1, then dropped to a low voltage point 2, and then returned to 0 volts to form a complete hysteresis cycle of the ferroelectric capacitor. To determine the charge stored in the ferroelectric capacitor in response to this changing voltage illustrated in FIG. 11, step 112 is used. In step 112 of FIG. 10, the history data from the default history table created in step 106 is accessed and curve modeling is performed between the data history points as indicated in eqs. 3–11 herein. Therefore, for each small change in voltage above the dvth threshold, a corresponding change in charge is determined and the total charge Q stored in the ferroelectric capacitor is accurately maintained via the eqs. 3–11 indicated herein. Once voltage point 1 is obtained in FIG. 11, step 114 notices that the voltage has attained a local maximum or local minimum wherein the local maximum and local minimum are referred to as extrema. An extrema point or local maximum or local minimum can be determined in FIG. 11 by determining when the derivative of the voltage with respect to time in FIG. 11 becomes zero. Since the voltage at point 1 in FIG. 11 is transitioning from a positive going voltage direction to a negative going voltage direction, the voltage derivative at point 1 must approach and cross zero. Therefore, point 1 is a local maximum and is a positive turning point which is stored in the history data file 542 of FIG. 9. In other words, when the local maximum of point 1 is determined in FIG. 11, step 116 of FIG. 10 stores in memory the charge resident in the ferroelectric capacitor at the time the voltage 1 of FIG. 11 is attained and stores the voltage across the capacitor at the maximum point 1 illustrated in FIG. 11. A typical history file would therefore contain:

| positive turning point | negative turning point |
| --- | --- |
| (+Vsat,Q(+Vsat)) | (−Vsat,Q(−Vsat)) |
| (V(1),Q(1)) | |

Where (+Vsat,Q(+Vsat)) and (−Vsat,Q(−Vsat)) are two dimensional points of voltage and charge that are provided by the default history file in step 106. The representation (V(1),Q(1)) is the voltage and charge on the capacitor at the time the point 1 is encountered in FIG. 11.

Therefore, this charge/voltage point 1 across the ferroelectric capacitor at the point 1 in FIG. 11 is stored in the data history file 542 of FIG. 9 as indicated above. An algorithm 118 is then performed to determine whether any old history data points may be removed from the history file 542 to maintain an efficient and compact history data file 542. The criterion for selectively removing old history data points is discussed in more detail with reference to FIG. 15 since no removal will occur due to the processing of FIGS. 11–14. Given the data history table, as updated via step 116 for FIG. 11, no data points need to be removed in step 118 due to the presence of point 1 in FIG. 11. If the simulation is at an end via step 120, then the algorithm terminates, else the step 110 is reexecuted in a looping manner so that the voltage across the ferroelectric capacitor can continually change.

After storing the local maximum data point 1 of FIG. 11 as indicated above, the steps 110 through 120 are repeated in order to store the charge voltage point corresponding to point 2 in FIG. 11 and continually update the charge on the capacitor as the voltage drops using eqs. 3–11. Point 2 is a local minimum (local extrema) and is stored in a negative turning point portion of the data history file. The data history file 542 remembers the order and time in which the negative turning point and positive turning points were encountered so that the history data file 542 understands that point 2 occurred directly after point 1 in FIG. 11:

| positive turning point | negative turning point |
| --- | --- |
| (+Vsat,Q(+Vsat)) | (−Vsat,Q(−Vsat)) |
| (V(1),Q(1)) | |
| | (V(2),Q(2)) |

Figure 12:
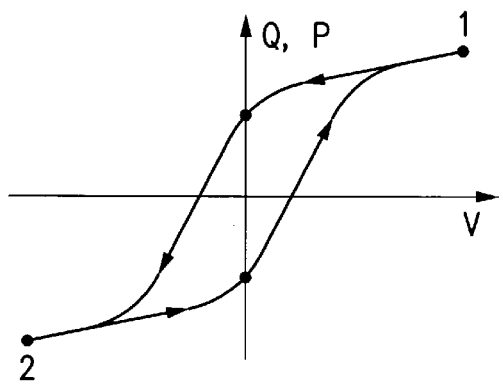

FIG. 12 indicates the charge stored in the ferroelectric capacitor as a function of voltage for the voltage versus time waveform of FIG. 11. Therefore, FIG. 12 illustrates a hysteresis loop which results from the voltage excitation illustrated in FIG. 11. The points 1 and 2 from FIG. 11 are illustrated in the hysteresis curve of FIG. 12.

Figure 13:
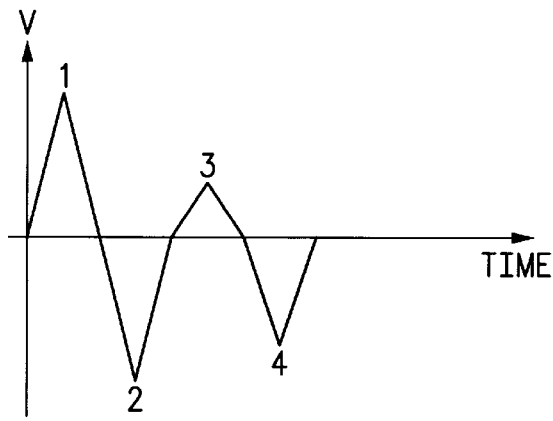

After returning to zero volts in FIG. 11, the voltage function via step 110 of FIG. 10 is then ramped up to a voltage 3 of FIG. 13 and then ramped down to a voltage 4 of FIG. 13. After attaining the voltage 4, the voltage across the ferroelectric capacitor is then returned to zero as illustrated in FIG. 13. The steps 110 through 120 of FIG. 10 identify and store the local maximum point 3 and the local minimum point 4 of FIG. 13 to provide for proper curve modeling via equation 3 as taught herein. In step 118, no data points in the data history file are determined to be removable as will be taught below in FIGS. 15–16. Therefore, the data history file 542 will contain two local maxima points 1 and 3 and two local minimum points 2 and 4 after the ferroelectric capacitor has been voltage excited as illustrated in FIG. 13:

| positive turning point | negative turning point |
| --- | --- |
| (+Vsat,Q(+Vsat)) | (−Vsat,Q(−Vsat)) |
| (V(1),Q(1)) | |
| | (V(2),Q(2)) |
| (V(3),Q(3)) | |
| | (V(4),Q(4)) |

Figure 14:
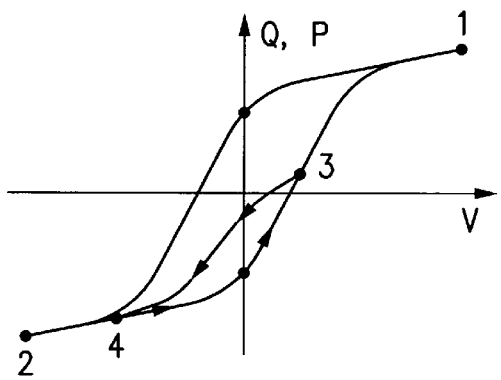
Figure 15:
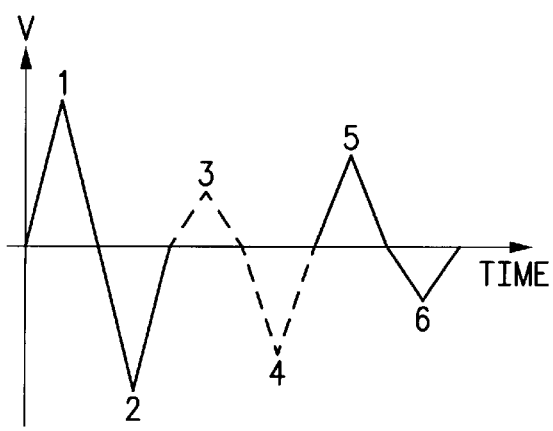

FIG. 14 illustrates that the excitation of the ferroelectric capacitor using voltage points 3 and 4 creates a minor hysteresis loop which lies within an outer hysteresis loop illustrated in FIG. 12. After the voltage points 3 and 4 are obtained, the steps 110 through 120 of FIG. 10 continue wherein the voltage point 5 and the voltage point 6 are attained as illustrated in FIG. 15. After storing the local maximum data point 5, step 118 of FIG. 10, selectively removed points 3 and 4 from the history data file:

| positive turning point | negative turning point |
| --- | --- |
| (+Vsat,Q(+Vsat)) | (−Vsat,Q(−Vsat)) |
| (V(1),Q(1)) | |
| | (V(2),Q(2)) |
| (V(5),Q(5)) | |

Next, the local data point 6 is saved in the history data file as indicated in step 116 of FIG. 10. Therefore, after arriving at zero volts at the end of FIG. 15, the data history file will contain the negative turning points 2 and 6 and the positive turning points 1 and 5, only:

| positive turning point | negative turning point |
| --- | --- |
| (+Vsat,Q(+Vsat)) | (−Vsat,Q(−Vsat)) |
| (V(1),Q(1)) | |
| | (V(2),Q(2)) |
| (V(5),Q(5)) | |
| | (V(6),Q(6)) |

Accordingly, the criterion for removing data points from the data history file are as follows. Once a local extrema is determined such as the local maximum point 5 above, all previous data points are compared to the voltage determined at point 5 to determine if any of the voltages of local maximum stored in the history data file are less then the voltage at point 5. It is clear from FIG. 15 that the local maximum point 3 is less in voltage value than the voltage value of local maximum point 5. Therefore, the local maximum point 3 can be removed from the history file 542 of FIG. 9 since it contains a voltage less than point 5. In general, when an old local maximum data point in file 542 is determined to be less than a new local maximum data point, the old local maximum data point is removed from the file 542 along with its following local minimum. Also, when an old local minimum data point in file 542 is determined to be greater than a new local minimum data point, the old local minimum data point is removed from the file 542 along with its following local maximum. Therefore, if the voltage at turning point 5 is greater than the voltage at turning point 3, the charge/voltage point 3 (represented as (V(3),Q(3))) is removed from the history file 542 along with the corresponding local minimum point 4 in FIG. 15 which occurs directly after point 3 in time. The data points 1 and 2 are not removed after attaining the point 5 in FIG. 15 since the local maximum point 1 is greater than the local maximum 5. Since this algorithm is repeated for each turning point encountered and stored in the history data file, the algorithm need not look further back in the history file than point 1 since all points less than point 1 should have been previously removed when point 1 was encountered previously and stored.

It is important to note that the same removal rule applies to local minima in a similar manner using absolute values. This removal technique for local minima is discussed below whereas the removal for local maxima was taught above using FIG. 15.

Figure 16:
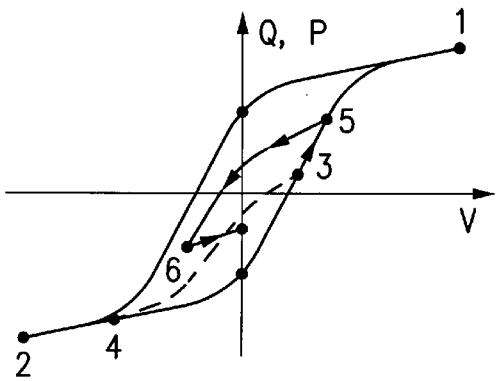

FIG. 16 illustrates the local hysteresis curve that is traversed given the excitation of voltage 5 and 6 from FIG. 15.

Figure 17:
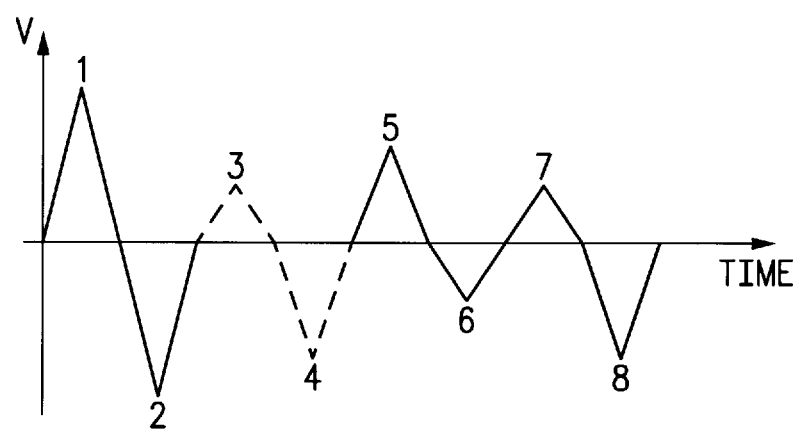

FIG. 17 illustrates that the ferroelectric capacitor is then exercised to a voltage maximum 7 followed by a voltage minimum 8. Since the local maximum 7 is less than the local maximum 5, and less than the local maximum 1, the step 118 of FIG. 10 will not remove the data points 5 and 6 or the data points 1 and 2 from the history database 542:

| positive turning point | negative turning point |
|---|---|
| (+Vsat,Q(+Vsat)) | (−Vsat,Q(−Vsat)) |
| (V(1),Q(1)) | |
| | (V(2),Q(2)) |
| (V(5),Q(5)) | |
| | (V(6),Q(6)) |
| (V(7),Q(7)) | |

However, a similar check is performed on local minima as well. Therefore, step 118 of FIG. 10 will compare point 8 to the local minima points 2 and 6 which are the only two remaining negative turning points within the history data file 542. Since the data point 6 is less than the data point 8 in absolute value (in other words, the point 6 is less negative than the point 8 or the point 6 is closer to the V axis than the point 8) the point 6 and the corresponding subsequent local maximum point 7 are removed from the data base 542 of FIG. 9. Therefore, after 0 volts is obtained at the end of FIG. 17, the data points stored as local maxima are points 1 and 5 and the data points stored as local minima are points 2 and 8:

| positive turning point | negative turning point |
|---|---|
| (+Vsat,Q(+Vsat)) | (−Vsat,Q(−Vsat)) |
| (V(1),Q(1)) | |
| | (V(2),Q(2)) |
| (V(5),Q(5)) | |
| | (V(8),Q(8)) |

Therefore, generally stated, the step 118 of FIG. 10 is used to remove pairs of local maxima and minima from the history data file 542 as these pairs of points are determined to be lesser in absolute value to subsequently occurring extrema given the criterion set forth above. It is important to note that when determining which points need to be removed from the data base, not all the points need to be compared to the current voltage charge maximum or minimum being added to the data base.

The software taught herein via code segments 1 and 2 may be provided to enable ferroelectric simulation via articles of manufacture which are manufactured to contain the software elements 540 and 544. These articles of manufacture may include one or more of: EPROM, EEPROM, ROM, DRAM, SRAM, magnetic storage, tape storage, optical storage, compact discs (CDs), flash memory storage, network storage, or like storage device for computer executable code or computer data.

The following C code is a code segment is designed for use with the Saber circuit simulator wherein this code segment defines the ferroelectric model taught herein:

Code Segment 1:

```
#include <stdio.h>
#include <stdlib.h>
#include <math.h>
#include <malloc.h>
struct tPoints {
        double     v,p;
        struct tPoints *up,*down;
};
struct sPoint {
        struct tPoints *entry;
        int   lastEntry;
};
struct   tPoints *allocTpoints( );
struct       sPoint *allocSpoint( );
void     mkEntry( );
void     addEntry( );
int      popUp( );
int      peekUp( );
void     dumpStack( );
void     getAb2( );
void     getAb4( );
double       getP( );
#define      LOOP2   2     /* Use equations 2 */
#define      LOOP4   4     /* Use equation 4 */
#define      INIT_CODE    1
#define      DC_INIT_CODE    2
```

-continued

```
#define      DC_DOMAIN_CODE   3
#define      GET_P_CODE       4
#define      TR_START_CODE    5
#define      TS_DONE_CODE 6
#define CODE         in[0]    /* misc: code for what to do       */
#define K            in[1]    /*      instance pusedo name       */
#define DUMP         in[2]    /*      diagnostic: dump the stack      */
#define FCWpo        in[3]    /* work: maximum polarization
    */
#define FCWvcp       in[4]    /*      coercive voltage for + going direction*/
#define FCWvcm       in[5]    /*      coercive voltage for − going direction*/
#define FCWa         in[6]    /*      shaping parameter         */
#define FCWcl        in[7]    /*      linear capacitance        */
#define FCWdpvb      in[8]    /* model: starting voltage of dynamic
depolarization*/
#define FCWdpvs      in[9]    /*      voltage increment for dynamic
depolarization*/
#define FCPpreset    in[10]   /* param: flag for major 100 eqn
    */
#define FCIv         in[11]   /* input: voltage at present time step    */
#define FCIvl        in[12]   /*      voltage at end of last time step   */
#define FCIdvl       in[13]   /*      delta v of last time step     */
#define FCIpl        in[14]   /*      polarization at last time step    */
#define FCIvdc       in[15]   /*      dc voltage             */
#define FCIpdc       in[16]   /*      dc polarization         */
#define FCOk         out[0]   /* out:    pointer to stack
    */
#define FCOp         out[0]   /*      computed polarization
    */
#define FCOdvl       out[0]   /*      last voltage increment      */
fc_(in,nin,ifl,nifl,out,nout,ofl,nofl,aundef,ier)
double in[ ],out[ ],*aundef;
int     *nin,*ifl,*nifl,*nout,*ofl,*nofl,*ier;
{
        struct    tPoints    *thisStack,*zz,*new;
        static struct   sPoint     **list=NULL;
        int       code,type,anyAbove,movedUp,changedDir,i,k;
        static int    nInst=0;
        double    dv,dvl,P,V1,P1,V2,P2,
            vc,dpvs,vLoad,vLoadLast;
        char    *name;
        code=(int)CODE;
        if( code==INIT_CODE && K==*aundef) {
                /* Build the list of instance psuedo names (K),
                    "psuedo names" are used for efficiency. */
                ++nInst;
                if(nInst==1) {
                        if((list=(struct sPoint **)malloc(sizeof(
                                struct sPoint *)))== NULL) {
                            printf("malloc error\n");
                            exit(0);
                        }
                }
                else if( (list=(struct sPoint **)realloc(list,
                            nInst*sizeof(struct sPoint *)))== NULL) {
                        printf("realloc error\n");
                        exit(0);
                }
                k=nInst−1;
                list[k]=allocSpoint( );
                FCOk=(double)k;
                return;
        }
        if(code==DC_INIT_CODE) {
                /* Either delete the stacks or preload them for
                    dynamic polarization. */
                k=(int)K;
                thisStack=list[k]−>entry;
                /* Always start the DC analysis with an empty stack unless
                    dynamic depolarization is specified. */
                /* Delete the stack if not NULL: */
                while(popUp(&thisStack)!=0);
                /* Preload the stack if depolarization specified. */
                if( FCWdpvb!= *aundef) {
                        zz=thisStack;
                        dpvs=fabs(FCWdpvs);
                        vLoad=FCWdpvb;
                                /* Dummy dv, for direction only */
                        dv=vLoad>0? 1:−1;
                        i=0;
```

```
                    for(;;) {
                        /* First 2 entries are via major loop eqs. */
                        if(i<=1) {
                                type=LOOP2;
                                V1=i*vLoadLast;
                                P1=i*P;
                                V2=0.0;
                                P2=0.0;
                        }
                        else {
                                type=LOOP4;
                                V1=zz—>v;
                                P1=zz—>p;
                                V2=zz—>up—>v;
                                P2=zz—>up—>p;
                        }
        P=getP(FCWa,FCWpo,FCWvcp,FCWvcm,type,vLoad,
                                        dv,V1,P1,V2,P2);
                        mkEntry(&new,vLoad,P);
                        addEntry(&zz,new);
                        vLoadLast=vLoad;
                        if(vLoad>0) vLoad = -(vLoad-dpvs);
                        else       vLoad = -(vLoad+dpvs);
                        if(vLoad>0 && vLoadLast>0)     break;
                        else if(vLoad<0 && vLoadLast<0) break;
                        dv = -dv;
                        ++i;
                    }
                    thisStack= zz;
                    /* Due to how preloading takes place, invert dv:
                       ie. -dv ==> dvl is +    */
                    if(dv>0) list[k]—>lastEntry= -1;    /* + to - */
                    else     list[k]—>lastEntry= 1;     /* - to + */
                    if((int)DUMP==1) {
                        printf("Dynamic depolarization: \n");
                        dumpStack(thisStack);
                    }
                }
                else {
                        list[k]—>lastEntry=0.0;
                }
                list[k]—>entry=thisStack;
                return;
            }
        }
        k=(int)K;
        thisStack=list[k]—>entry;
        if(code==DC_DOMAIN_CODE) {
                zz=thisStack;
                /* Get P for the DC analysis */
                if( FCWdpvb==*aundef ) {
                        /*
                        On a major loop or (v=0,p=0)
                         preset=1 ==> top
                         preset=2 ==> bottom
                         preset=0 ==> (0,0)
                        */
                        if((int)FCFpreset==1)    vc=FCWvcm;
                        else if((int)FCFpreset==2) vc=FCWvcp;
                        else if((int)FCFpreset==3) vc=0.0;
                        P = FCWpo*tanh(FCWa*(FCIv-vc));
                }
                else {
                        /* Capacitor has been dynamically depolarized. */
                        if((zz==NULL) || (zz—>up==NULL)) {
                            printf("error: Stack is empty or has only one \
entry. Check dpvb & dpvs.\n");
                                exit(0);
                        }
                        else {
                        /* ic should should always force FCIv to zero
                           here. */
                           dv=FCIv-zz—>v;
        P=getP(FCWa,FCWpo,FCWvcp,FCWvcm,LOOP4,FCIv,dv,
                           zz—>v,zz—>p,zz—>up—>v,zz—>up—>p);
                        }
                }
                FCOp=P;
                return;
        }
        if(code==TR_START_CODE) {
```

```
/*
This piece of code is required to ensure the stack is entered
properly if it is either preloaded or the continuity of the
simulation is broken. The latter applies when another
transient run is invoked without performing another DC
analysis (which either clears the stack or preloads it). The
user must beware of any consequences if a simulation is begun
using a previously built stack.
*/
if( FCIdvl==*aundef ||
    ( FCIdvl>0 && list[k]—>lastEntry<0) ||
    ( FCIdvl<0 && list[k]—>lastEntry>0)) {
        dvl=list[k]—>lastEntry;
}
FCOdvl=dvl;
return;
}
dv=FCIv-FCIvl;      /* increment for this step */
dvl=FCIdvl;
if(dv==0){
    FCOp=FCIpl;
    return;
}
if(code==GET_P_CODE) {
    zz=thisStack;
    movedUp=0;
    /* See if the applied voltage has changed direction */
    if((dv>0 && dvl>0) || (dv<0 && dvl<0) || (dvl == 0.0)) {
        changedDir=0;
    }
    else if((dv<0 & dvl>0) || (dv>0 & dvl<0)) {
        changedDir=1;
    }
    else {
        printf("error on direction change\n");
        exit(0);
    }
    if(zz!=NULL) {
        if( changedDir==0) {
            if( peekUp(zz)>=1 ) {
                if(dv>0) {
                    if(FCIv>=zz—>up—>v) {
                        mvUp(&zz);
                        movedUp=1;
                        while( peekUp(zz)==2) {
                            if(FCIv>=zz—>up—>up—>v){
                                mvUp(&zz);
                                mvUp(&zz);
                            }
                            else {
                                break;
                            }
                        }
                    }
                }
                else {
                    if(FCIv<=zz—>up—>v) {
                        mvUp(&zz);
                        movedUp=1;
                        while( peekUp(zz) == 2 ) {
                            if(FCIv<=zz—>up—>up—>v){
                                mvUp(&zz);
                                mvUp(&zz);
                            }
                            else {
                                break;
                            }
                        }
                    }
                }
            }
        }
        else if( changedDir==1 ) {
        /* Since v has changed direction for this increment we
           must construct a dummy stack that would be the new
           stack if FCIvl was indeed a turning point.
           First move up the stack in pairs until the psuedo
           turning point for the last voltage is found: */
            if( dv<0) {         /* + to - entry */
                while( peekUp(zz)>=1 ) {
```

```
                    if(FCIvl>=zz—->up—>v) {
                            mvUp(&zz);
                            mvUp(&zz);
                    }
                    else {
                            break;
                    }
            }
    }
    else if( dv>0 ) {          /* - to + entry */
            while( peekUp(zz)>=1) {
                    if(FCIvl<=zz—->up—>v) {
                            mvUp(&zz);
                            mvUp(&zz);
                    }
                    else {
                            break;
                    }
            }
    }
    /* The first entry is now represented by FCIv and FCIp
      while the rest of the stack is accessed via zz */
    if( peekUp(zz)>=0) {
            if(dv>0) {
                    if(FCIv>=zz—>v) {
                            mvUp(&zz);
                            movedUp=1;
                            while( peekUp(zz)==2) {
                                    if(FCIv>=zz—->up—>v){
                                            mvUp(&zz);
                                            mvUp(&zz);
                                    }
                                    else {
                                            break;
                                    }
                            }
                    }
            }
            else {
                    if(FCIv<=zz—>v) {
                            mvUp(&zz);
                            movedUp=1;
                            while( peekUp(zz) ==2) {
                                    if(FCIv<=zz—->up—>v){
                                            mvUp(&zz);
                                            mvUp(&zz);
                                    }
                                    else {
                                            break;
                                    }
                            }
                    }
            }
    }
}
}
anyAbove=peekUp(zz);
        if( changedDir==0) {
                if(anyAbove>=0) {
                        V1=zz—>v;
                        P1=zz—>p;
                }
                else {
                        V1=FCIvdc;
                        P1=FCIpdc;
                }
        }
        else if( changedDir==1 ) {
                V1=FCIvl;
                P1=FCIpl;
        }
        if( anyAbove== -1 ){
                type=LOOP2;
        }
        else if( changedDir==0){
                if( anyAbove==0 && movedUp==0 ){
                        type=LOOP2;
                }
                else if( anyAbove==1 && movedUp==1 ){
                        type=LOOP2;
```

```
                    }
                    else if( anyAbove>=1 && movedUp==0 ){
                        type=LOOP4;
                        V2=zz—>up—>v;
                        P2=zz—>up—>p;
                    }
                    else if( anyAbove==0 && movedUp==1 ){
                        type=LOOP2;
                    }
                    else if( anyAbove>=2 && movedUp==1 ){
                        type=LOOP4;
                        V2=zz—>up—>up—>v;
                        P2=zz—>up—>up—>p;
                    }
                }
                else if( changedDir==1 ) {
                    if( anyAbove>=0 && movedUp==0 ){
                        type=LOOP4;
                        V2=zz—>v;
                        P2=zz—>p;
                    }
                    else if( anyAbove==0 && movedUp==1 ){
                        type=LOOP2;
                    }
                    else if( anyAbove>=1 && movedUp==1 ){
                        type=LOOP4;
                        V2=zz—>up—>v;
                        P2=zz—>up—>p;
                    }
                }
                else {
                    printf("error on conditionals\n");
                    exit(0);
                }
    FCOp=getP(FCWa,FCWpo,FCWvcp,FCWvcm,type,FCIv,dv,V1,P1,V2,
P2);
            }
            if(code==TS_DONE_CODE) {
                /*
                ... The current time step is now defined, no more iterations.
                    Now update the stack if a turning point has just been
                    passed.
                */
                /* check for turning points */
                if(((dv<0 && dvl>0) || (dv>0 && dvl<0))) {
                    zz=thisStack;
                    if(dv<0) {          /*+ to - entry */
                        while( peekUp(zz)>=1) {
                            if(FCIv1>=zz—>up—>v) {
                                popUp(&zz);
                                popUp(&zz);
                            }
                            else {
                                break;
                            }
                        }
                    }
                    else if( dv>0) {        /* - to + entry */
                        while( peekUp(zz)>=1 ) {
                            if(FCIvl<=zz—>up—>v) {
                                popUp(&zz);
                                popUp(&zz);
                            }
                            else {
                                break;
                            }
                        }
                    }
                    mkEntry(&new,FCIvl,FCIpl);
                    addEntry(&zz,new);
                    if((int)DUMP==1) dumpStack(zz);
                    /* Set pointer to the current entry. */
                    list[k]—>entry=zz;
                    /* Save the direction associated with the last entry. */
                    if(dv>0) list[k]—>lastEntry= 1;
                    else     list[k]—>lastEntry= -1;
                }
                else if( dvl == 0.0) {
                    zz=thisStack;
                    if((FCPpreset==1 & dv>0) || (FCPpreset==2 & dv<0)) {
```

```
                    mkEntry(&new,FCIvl,FCIpl);
                    addEntry(&zz,new);
                    if((int)DUMP==1) dumpStack(zz);
                    /* Set pointer to the current entry. */
                    list[k]—>entry=zz;
                    /* Save the direction associated with the
                       last entry. */
                    if(dv>0) list[k]—>lastEntry= 1;
                    else     list[k]—>lastEntry= -1;
                }
            }
        }
}
/*|||||||||||||||||||||||||||||||||||||||||||||||||||||*/
struct tPoints *allocTpoints( )
{
        struct tPoints *added;
        if((added=(struct tPoints *)malloc(sizeof(struct tPoints))) == NULL ) {
                printf("malloc error\n");
                exit(0);
        }
        added—>v=NULL;
        added—>up=NULL;
        added—>down=NULL;
        added—>down=NULL;
        return(added);
}
/*|||||||||||||||||||||||||||||||||||||||||||||||||||||*/
struct sPoint *allocSpoint( )
        struct sPoint *added;
        if((added=(struct sPoint *)malloc(sizeof(struct sPoint))) == NULL ) {
                printf("malloc error\n");
                exit(0);
        }
        added—>entry=NULL;
        added—>lastEntry=0.0;
        return(added);
}
/*|||||||||||||||||||||||||||||||||||||||||||||||||||||*/
void mkEntry(new,v,p)
struct    tPoints **new;
double    v,p;
{
        *new=allocTpoints( );
        (*new)—>v=v;
        (*new)—>p=p;
}
/*|||||||||||||||||||||||||||||||||||||||||||||||||||||*/
void addEntry(old,new)
struct tPoints **old,*new;
{
        if(*old==NULL) {          /* first link */
                new—>up=NULL;
                new—>down=NULL;
        }
        else if((*old)—>down==NULL)
                new—>up= *old;
                new—>down=NULL;
                (*old)—>down=new;
        }
        *old=new;
}
/*|||||||||||||||||||||||||||||||||||||||||||||||||||||*/
int popUp(c)
struct tPoints **c;
{
        struct tPoints *upOne;
        if(*c==NULL) {
                return(0);        /* no entries */
        }
        if((*c)—>up==NULL) {      /* only one entry */
                free(*c);
                *c=NULL;
                return(1);
        }
        else if((*c)—>up!=NULL) {  /* more than one entry*/
                upOne=(*c)—>up;
                upOne—>down=NULL;
                free(*c);
                *c=upOne;
```

```
                    return(2);
            }
            else {
                    printf("popUp: invalid pointer\n");
                    exit(0);
            }
}
/*|||||||||||||||||||||||||||||||||||||||||||||||||||*/
int mvUp(c)
struct tPoints **c;
{
        if(*c==NULL) {
                return(0);           /* no entries */
        }
        else if((*c)—>up==NULL) {    /* only one entry */
                *c=NULL              /* added 8_19 */
                return(1);
        }
        else if((*c)—>up!=NULL) {    /* more than one entry*/
                *c=(*C)—>up;
                return(2);
        }
        else {
                printf("mvUp: invalid pointer\n");
                exit(0);
        }
}
/*|||||||||||||||||||||||||||||||||||||||||||||||||||*/
int peekUp(c)
struct tPoints *c;
{
        if(c==NULL) {         /* no entries at all */
                return(-1);
        }
        if(c—>up!=NULL) {     /* at least 2 entries above*/
                if(((c—>up)—>up)!=NULL) return(2);
                return(1);           /* only one entry above*/
        }
        else return(0);              /* no entries above */
}
/*|||||||||||||||||||||||||||||||||||||||||||||||||||*/
void dumpStack(c)
struct tPoints *c;
{
        printf("\nStack altered:\n");
        if(c!=NULL) {
                while(c—>up!=NULL) c=c—>up;
                for(;;) {
                        printf("v=%20.10le p=%20.10le\n",c—>v,c—>p);
                        if(c—>down!=NULL) c=c—>down;
                        else break;
                }
        }
        else {
                printf("    Empty stack.");
        }
        printf("\n");
}
/*|||||||||||||||||||||||||||||||||||||||||||||||||||*/
void getAb2(a,Vc,Po,Vi,Pi,alpha,beta)
double   a,Vc,Po,Vi,Pi,*alpha,*beta;
{
        double      xp,exp_m,exp_p,exp_s;
        xp=a*(Vi-Vc);
        exp_m=exp(-xp);
        exp_p=exp( xp);
        exp_s= exp_p + exp_m;
        *alpha=(exp_m + Pi/Po*(exp_s))/exp_p;
        *beta =(exp_p - Pi/Po*(exp_s))/exp_m;
}
/*|||||||||||||||||||||||||||||||||||||||||||||||||||*/
void getAb4(a,Vc,Po,V1,P1,V2,P2,alpha,beta)
double   a,Vc,PO,V1,P1,V2,P2,*alpha,*beta;
{
        double         A,B,det,
                xp1,exp_m1,exp_p1,
                xp2,exp_m2,exp_p2;
        xp1 =a*(V1-Vc);
        exp_m1=exp(-xp1);
        exp_p1=exp( xp1);
```

```
        xp2=a*(V2-Vc);
        exp__m2=exp(-xp2);
        exp__p2=exp( xp2);
        A=P1*(exp__p1+exp__m1)/Po;
        B=P2*(exp__p2+exp__m2)/Po;
        det= -exp__p1*exp__m2+exp__m1*exp__p2;
        *alpha = (-exp__m2*A+exp__m1*B)/det;
        *beta = (-exp__p2*A+exp__p1*B)/det;
}
/*|||||||||||||||||||||||||||||||||||||||||||||||||*/
double      getP(a,po,vcp,vcm,type,v,dv,V1,P1,V2,P2)
double      a,po,vcp,vcm,v,dv,V1,P1,V2,P2;
int     type;
{
        double P,alpha,beta,vc,xp,exp__m,exp__p,exp__s;
        vc = (dv<0)? vcm:vcp;
        if(type==LOOP2) {
                getAb2(a,vc,po,V1,P1,&alpha,&beta);
        }
        else if(type==LOOP4) {
                getAb4(a,vc,po,V1,P1,V2,P2,&alpha,&beta);
        }
        xp=a*(v-vc);
        exp__m=exp(-xp);
        exp__p=exp( xp);
        exp__s=exp__p+exp__m;
        if(type==LOOP2) {
                if(dv<0) P=po*(alpha*exp__p-exp__m)/exp__s;
                else     P=po*(exp__p-beta*exp__m)/exp__s;
        }
        else if(type==LOOP4) {
                P=po*(alpha*exp__p-beta*exp__m)/exp__s;
        }
        return(P);
}
```

The following is a Saber code segment that is used utilized the C ferroelectric model above to simulate a ferroelectric capacitor and allow for the cost effective and time efficient manufacture of integrated circuit containing ferroelectric capacitors:

Code Segment 2:

```
element template fc p m = model,l,w,rleak,esr,ic,preset,dump
electrical      p,m
struc {
        number      po=undef,       # Maximum polarization, femptoCoulombs/um^2
                vc=undef,            # coercive voltage
                vca=0,               # asymmetry parameter for vc: vc —> vc+vca
                                     #       vc —>-(vc-vca)
                a=undef,             # shaping parameter
                cl=0,                # linear capacitance
                dpvb=undef,          # beginning voltage for generating a poled device
                dpvs=undef,          # voltage step for generating a poled device
                dvth=1n,             # minimum voltage increment required to alter
                                     #    polarization
                tcpo[2]=[0,0],       # temperature coefficients for Po
                tcvc[2]=[0,0],       # temperature coefficients for Vc
                tca[2]=[0,0],        # temperature coefficients for a
                tccl[2]=[0,0],       # temperature coefficients for cl
                tnom=27                  # temperature at which paramters were extracted
        } model=( )
        number   l=undef,            # capacitor width (m)
                w=undef,             # capacitor length (m)
                esr=0,               # equivalent series resistance
                rleak=inf,           # parallel leakage resistance
                ic=undef,            # initial condition on vcap
                dump=0               # diagnostic parameter:
                                     #   0 do nothing
                                     #   1 dump stack after each new turning
                                     #     point or dynamic depolarization
        enum{__t,__b,__} preset=__0  # initial setting on the hysterisis curve
                                     #   __t top, on a major loop
                                     #   __b bottom, on a major loop
                                     #   __0 forces (v=0,p=0); sets ic to 0.
        {
                #. . . declare internal node
                electrical pi
```

```
        struc {
            number      po,vcp,vcm, # Model parameters scaled with temperature.
                        a,cl,
                        dpvb,dpvs # Included here so model does not have to
                                  #      be passed to fc.
        } work=( )
        number          area,xic,xesr,xgleak,dt,
                        vcts,            # temperatre scaled vc
                        k=undef          # instance psuedo name
        state   v       s_v=undef,  # voltage of last step
                        s_dv=undef, # last voltage step
                        s_vdc       # dc voltage
        state   q       s_p=undef, _pdc=undef
        val     v       v,          # voltage across device; v=vesr+vcap
                        dv,         # v(this step)-v(last saved step)
                        vesr,       # voltage across equivalent series resistance
                        vcap,       # voltage across fe capacitor and parallel
                                    #    leakage resistance
                        dvl         # last voltage increment; for stack entry
        val     q       h,          # nomalized ferroelectric polarization
                        qf,         # ferroelectric capacitor charge, h*area
                        ql,         # linear capacitor charge
                        qt          # total charge
        val     i       iesr,       # current in series resistance
                        ileak       # current in leakage resistance
        vazl    ru      w_po,w_vcp,w_vcm,w_a,w_cl
        struc sa_points {
                number breakpoint,increment
                } svv[*]=[ (-50meg,100),(-1k,10),(-100,1),(-20,0.01),
                           (0,0.01),(20,1),(100,10),(1k,100),(50meg,0) ],
                  svn[*]=[ (-10,.5),(0,.5),(10,0) ]
        group {qf,ql,qt}       q    # for output
        foreign fc
        external number         temp
#++++++++++++++++++++++++++++++++++++++++++++++++++++++++++++++++++
+++++
parameters {
        # device parameter checking
        if(1 <= 0 | 1 == undef | 1 == inf) {
                error("length is incorrectly specified in %",instance( ))
                }
        if(w <= 0 | w == undef | w == inf) {
                error("width is incorrectly specified in %",instance( ))
                }
        if( preset~=_t ) if( preset~=_b) if(preset~=_0) {
                error("preset must be _t, _b, or _0 in %",instance( ))
                }
        if(ic == inf) {
                error("ic is incorrectly specified in %",instance( ))
                }
        else if( ic~=0 & ic~=undef & preset==_0) {
                warning("preset is 0 in %, therefore ic set to 0",instance( ))
                }
        # model parameter checking
        if(model->po < 0 | model->po == undef | model->po == inf) {
                error("Po is incorrectly specified in %",instance( ))
                }
        if(model->vc < 0 | model->vc == undef | model->vc == inf) {
                error("vc is incorrectly specified in %",instance( ))
                }
        if(model->vca == undef | model->vca == inf) {
                error("vca is incorrectly specified in %",instance( ))
                }
        if(model->a < 0 | model->a == undef | model->a == inf) {
                erropr("a is incorrectly specified in %", instance( ))
                }
        if(model->cl < 0 | model->cl == undef | model->c1 == inf) {
                error("cl is incorrectly specified in %",instance( ))
                }
        if(model->dpvs == inf | model->dpvs==0) {
                error("dpvs is incorrectly specified in %",instance( ))
                }
        if(model->dpvs == inf | model->dpvs==0) {
                error("dpvs is incorrectly specified in %",instance( ))
                }
        if((model->dpvb ~= undef & model->dpvs==undef) |
           (model->dpvb == undef & model->dpvs~=undef)) {
                error("dpvb & dpvs must both be undef or defined %",instance( ))
                }
        if( ic ~= &ic~=undef & model->dpvb~=undef ) {
```

```
                warning("dpvb is set in %, therefore ic set to 0",instance( ))
                }
        if( model—>dvth == inf | model—>dvth==undef | model—>dvth< ) {
                error("dvth is incorrectly specified in %",instance( ))
                }
                }
        if(esr >= 0 & esr ~= undef & est ~= inf) {
                xesr = esr
                }
        else if(esr == undef) {
                warning("esr is undefined in %; changed to 0",instance( ))
                xesr = 0
                }
                else if (esr == inf) {
                error("esr is inf in %; open circuit",instance( ))
                }
        else {
                error("esr is <0 %",instance( ))
                }
        if(rleak < 0 & rleak ~= undef & rleak ~= inf) {
                xgleak = 1/rleak
                }
        else if (rleak == inf) {
                xgleak = 0
                }
        else if(rleak == undef) {
                warning("rleak is undefined in %; changed to inf",instance( ))
                xgleak = 0
                }
        else ( # rleak <= 0
                error("rleak is <=0 in %",instance( ))
                }
        # temperature scaling
        dt=temp-model—>tnom
        work—>po = model—>po*(1 + model—>tcpo[1]*dt + model—>tcpo[2]*(dt**2))
        vcts     = model—>vc*(1 + model—>tcvc[1]*dt + model—>tcvc[2]*(dt**2))
        work—>a  = model—>a *(1 + model—>tca[1] *dt + model—>tca[2] *(dt**2))
        work—>cl = model—>cl*(1 + model—>tcc[1]*dt + model—>tccl[2]*(dt**2))
        work—>dpvb = model—>dpvb
        work—>dpvs = model—>dpvs
        # area scaling
        area=1*w*1e12                         # convert from m^2 to um^2
        work—>cl=work—>cl * area
        # preset=0 ==> polarization is 0, therefore must set xic to 0
        # dpvb specified ==> xic =0
        if(preset==_0 | model—>dpvb~=undef) {
                xic=0
                }
        else        xic=ic
        # add asymmetry to vc
        work—>vcp = vcts + model—>vca
        work—>vcm = -(vcts - model—>vca)
        # Generate a list of pointers to stack.
        # A new list will be created everytime an alter is performed.
        k=fc(1,k,dump,work)
        }
when(dc_init) {
        fc(2,k,dump,work)
}
when(dc_done) {
        s_vdc=vcap
        s_v=vcap
        s_pdc=h
        s_p=h
        }
when(tr_start) {
        # s_dv (dvl) is critical to determining the turning points and for
        # proper entry into the stack. It is the direction of the last voltage
        # increment. Here it is obtained from the dynamic depolarized stack or
        # from the last dv from the previous tr analysis; otherwise it is
        # 0.0 if starting from a DC analysis.
        s_dv=fc(5,k,dump,work,preset,vcap,s_v,s_dv,s_p,s_vdc,s_pdc)
}
when(time_step_done) {
        # Update the stack and state variables if required. This will only
        # be done if the voltage across the ferroelectric cap at this step is
        # dvth greater (or less) than the last voltage stored in s_v.
        if(abs(dv)>=model—>dvth) {
                fc(6,k,dump,work,preset,vcap,s_v,s_dv,s_p)
                s_dv=vcap-s_v
```

```
                    s_v=vcap
                    s_p=h
                }
        }
values {
        v  =v(p)-v(m)
        vesr=v(p)-v(pi)
        vcap=v(pi)-v(m)
        dv=vcap-s_v
        if(dc_domain) {
                h=fc(3,k,dump,work,preset,vcap,s_v,s_dv,s_p,s_vdc,s_pdc)
        }
        else {
                if(abs(dv)>=model—>dvth) {
                        h=fc(4,k,dump,work,preset,cvap,s_v,s_dv,s_p,s_vdc,s_pdc)
                }
                else h=s_p
        }
        qf=h*area
        ql=work—>cl*vcap
        qt=ql+qf
        ileak=xgleak*vcap
        if(xesr ~= 0) {
                iesr = vesr/xesr
        }
        else {
                iser = 0
        }
        # for diagnostic testing only, left in per Bo Jaing.
        w_po  =work—>po
        w_vcp =work—>vcp
        w_vcm =work—>vcm
        w_a   =work—>a
        w_cl  =work—>cl
}
control_section {
        pl_set(qt,vcap)
        sample_points(vcap,svv)
        newton_step(vcap,svn)
        initial_condition(vcap,xic)
        # Collapse internal node if series resistance is 0
        if(xesr == 0) collapse(p,pi)
}
equations {
        if(xesr == 0) {
                i(p—>m) += d_by_dt(qt) + ileak
        }
        else {
                i(p—>pi) += iesr
                i(pi—>m) += d_by_dt(qt) + ileak
        }
}
}
```

While the present invention has been illustrated and described with reference to specific embodiments, further modifications and improvements will occur to those skilled in the art. For example, plurality as used herein is intended to mean any number between 2 and infinity and is not to be limited to any particular constant or sub-range. Other microprocessor systems other than that illustrated in FIG. 9 may be used to simulate the ferroelectric devices taught herein. Any ferroelectric device other than the devices of FIGS. 7–8 can be simulated as taught herein. Further, the code segments included herein may be copied for purposes of distribution of this patent, however, all other copyright rights are preserved. It is to be understood, therefore, that this invention is not limited to the particular forms illustrated and that it is intended in the appended claims to cover all modifications that do not depart from the spirit and scope of this invention.

What is claimed is:

1. A method for storing history data while exercising a ferroelectric capacitor, the method comprising the steps of:

(a) providing a model of the ferroelectric capacitor in computer-readable memory;

(b) providing a voltage to the model of the ferroelectric capacitor wherein the voltage varies over time;

(c) identifying a new local extremum in the voltage as the voltage varies over time;

(d) using the new local extremum to determine if old local extrema should be removed from the history data and removing any old local extrema that are identified as removable;

(e) adding the new local extremum to the history data; and (f) repeating steps (c) through (f) for a simulation time period of the ferroelectric capacitor.

2. The method of claim 1 wherein the step (c) further comprises: identifying the new local extremum as a new local minimum in the voltage over time.

3. The method of claim 2 wherein the step (d) comprises two substeps (d1) and (d2), the substeps (d1) and (d2) comprising:

(d1) removing an old local minimum in the history data that is greater in numerical value than the new local minimum; and (d2) removing a local maximum that is recorded directly after the old local minimum determined in (d1).

4. The method of claim 3 wherein the steps (d1) and (d2) are repeated a plurality of times to remove more than two extrema from the history data.

5. The method of claim 3 wherein the steps (d1) and (d2) are repeated a plurality of times until an old local minimum is encountered that is less than the new local minimum in numerical value.

6. The method of claim 1 wherein the step (c) further comprises: identifying the new local extremum as a new local maximum in the voltage over time.

7. The method of claim 6 wherein the step (d) comprises two substeps (d1) and (d2), the substeps (d1) and (d2) comprising:
(d1) removing an old local maximum in the history data that is lesser in numerical value than the new local maximum; and
(d2) removing a local minimum that is recorded directly after the old local maximum determined in (d1).

8. The method of claim 7 wherein the steps (d1) and (d2) are repeated a plurality of times to remove more than two extrema from the history data.

9. The method of claim 7 wherein the steps (d1) and (d2) are repeated a plurality of times until an old local maximum is encountered that is greater than the new local maximum.

10. The method of claim 1 wherein the steps (d) comprises:
removing old local extrema from the history data in pairs wherein a first extrema in a pair is a local minimum and a second extrema in the pair is a local maximum.

11. The method of claim 1 wherein the steps (d) comprises:
removing old local extrema from the history data in real time while using the history data to simulate the ferroelectric capacitor as the voltage varies over time.

12. The method of claim 1 wherein the steps (c) comprises:
determining an extrema as being a point where a derivative of the voltage with respect to time is zero.

13. The method of claim 1 wherein the steps (c) comprises:
determining an extrema as being a point where a slope of the voltage with respect to time is zero.

14. The method of claim 1 further comprising:
using the history data at various points in time to determine, in response to a changing of the voltage across the ferroelectric capacitor, an amount of charge (Q) stored in the ferroelectric capacitor.

15. The method of claim 1 wherein the step (d) further comprises:
storing in the history data a charge (Q) resident within the ferroelectric capacitor, the charge (Q) being stored for each extrema in voltage determined in step (d) whereby each extrema of voltage which is stored is associated with a stored charge (Q) wherein both the stored charge (Q) and related extrema in voltage resulted at a same point in time.

16. The method of claim 15 wherein the step (d) further comprises:
deleting selected stored charge (Q) entries which correspond to extrema in voltage which are identified as removable in step (d).

17. The method of claim 15 further comprising:
using a high voltage saturation point and a low voltage saturation point as history data when no other extrema in voltage are stored within the history data.

18. The method of claim 15 further comprising:
using less than +6 V and greater than −6 V as the extrema in the history data when beginning simulation.

19. The method of claim 1 wherein the model of the ferroelectric capacitor has a plurality of model coefficients which are scalable with temperature to properly model the ferroelectric capacitor under differing temperature conditions.

20. The method of claim 19 wherein the plurality of model coefficients which are scalable with temperature include an initial saturated ferroelectric charge parameter Qo, an initial non-ferroelectric capacitor capacitance parameter Cl, and an initial coercive voltage parameter Vc which characterizes a charge/voltage curve of the ferroelectric capacitor.

21. The method of claim 20 wherein ferroelectric temperature scaling is performed by performing steps comprising:
providing, as input to the model of the ferroelectric capacitor, a temperature at which ferroelectric simulation is to occur;
changing the initial saturated ferroelectric charge parameter Qo in response to the temperature to create a new saturated ferroelectric charge parameter Qo;
changing the initial non-ferroelectric capacitor capacitance parameter Cl in response to the temperature to create a new non-ferroelectric capacitor capacitance parameter Cl;
changing the initial coercive voltage parameter Vc in response to the temperature to create a new coercive voltage parameter Vc; and
simulating the ferroelectric capacitor at the temperature using the model of the ferroelectric capacitor along with the new saturated ferroelectric charge parameter Qo, the new non-ferroelectric capacitor capacitance parameter Cl, and the new coercive voltage parameter Vc.

22. A method for simulating a ferroelectric capacitor comprising the steps of:
providing at least one maximum history data voltage/charge point and at least one minimum history data voltage/charge point in a history data file, wherein both the at least one maximum history data voltage/charge point and the at least one minimum history data voltage/charge point are data points where a derivative of a voltage with respect to time across the ferroelectric capacitor is zero;
identifying a current voltage/charge point for the ferroelectric capacitor where the ferroelectric capacitor is currently operating; and
incrementing the voltage across the ferroelectric capacitor while simulating, and determining a charge stored in the ferroelectric capacitor by curve modeling between the current voltage/charge point and a selected at least one maximum history data point.

23. The method of claim 22 wherein the step of incrementing comprises:
determining the selected at least one maximum history data point as being a data point that is closest to the current voltage/charge point while still being greater in voltage than the current voltage/charge point.

24. The method of claim 22 wherein the step of incrementing comprises:
curve modeling by calculating at least one exponential term wherein the at least one exponential term is some function of the voltage of the current voltage/charge point.

25. The method of claim 22 wherein the step of incrementing comprises:

finding the charge stored in the ferroelectric capacitor by using the equation:

$$Q = Q_0 \frac{\alpha \cdot \exp(a(V - V_c)) - \beta \cdot \exp(-a(V - V_c))}{\exp(-a(V - V_c)) + \exp(a(V - V_c))} + C_l V$$

where:
- V=the voltage from the voltage/charge point
- $V_c$=an initial coercive voltage parameter from memory, positive when V is increasing and negative when V is decreasing
- $Q_o$=an initial saturated ferroelectric charge parameter from memory
- $C_l$=an initial non-ferroelectric capacitor capacitance parameter from memory
- a=a curve shaping parameter read from memory
- α=a value between 0 and 1
- β=a value between 0 and 1.

26. The method of claim 22 wherein the step of incrementing comprises:

curve fitting by reading a shaping parameter, a, from memory wherein the shaping parameter determines a curvature of hysteresis loops of the ferroelectric capacitor.

27. The method of claim 22 wherein a ferroelectric model is used to simulate the ferroelectric capacitor, the ferroelectric model having a plurality of model values, the plurality of model values including an initial saturated ferroelectric charge parameter Qo, an initial non-ferroelectric capacitor capacitance parameter Cl, and an initial coercive voltage parameter Vc which characterizes a charge/voltage curve of the ferroelectric capacitor wherein each of the model values Qo, Cl, and Vc are adjustable according to temperature.

28. The method of claim 27 wherein one or more of the model values Qo, Cl, and Vc are adjustable according to temperature by multiplying each model value by a polynomial temperature adjustment factor $(1+c_1(\Delta T)+c_2(\Delta T)^2)$ wherein:

- ΔT is a change in temperature from a default temperature used to determine the initial saturated ferroelectric charge parameter Qo, the initial non-ferroelectric capacitor capacitance parameter Cl, and the initial coercive voltage parameter Vc;
- $c_1$ is a different first constant for each of the initial saturated ferroelectric charge parameter Qo, the initial non-ferroelectric capacitor capacitance parameter Cl, and the initial coercive voltage parameter Vc; and
- $c_2$ is a different second constant for each of the initial saturated ferroelectric charge parameter Qo, the initial non-ferroelectric capacitor capacitance parameter Cl, and the initial coercive voltage parameter Vc.

29. The method of claim 22 wherein the step of providing comprises:

selectively removing from the history data file, upon satisfaction of a predetermined condition, one maximum history data voltage/charge point and one minimum history data voltage/charge point wherein the one minimum history data voltage/charge point is adjacent in time to the one maximum history data voltage/charge point.

30. The method of claim 29 wherein the step of selectively removing comprises:

removing the one maximum history data voltage/charge point and the one minimum history data voltage/charge point from the history data file if a new maximum history data voltage/charge point is greater in value than the one maximum history data voltage/charge point.

31. The method of claim 29 wherein the step of selectively removing comprises:

removing the one maximum history data voltage/charge point and the one minimum history data voltage/charge point from the history data file if a new minimum history data voltage/charge point is lesser in value than the one minimum history data voltage/charge point.

32. The method of claim 22 further comprising:

selectively removing, over time, at least one pair of values from the history data file while simulation of the ferroelectric capacitor is progressing, the at least one pair comprising one maximum history data voltage/charge point and one minimum history data voltage/charge point.

33. The method of claim 22 wherein the step of incrementing further comprises:

curve modeling a maximum-size outer ferroelectric loop of the ferroelectric capacitor using a representation:

$$Q = Q_o \cdot \tan h(a(V-V_c)) + C_l V$$

where:
- V=the voltage from the voltage/charge point
- $V_c$=an initial coercive voltage parameter from memory, positive when V is increasing and negative when V is decreasing
- $Q_0$=an initial saturated ferroelectric charge parameter from memory
- $C_l$=an initial non-ferroelectric capacitor capacitance parameter from memory
- a=a curve shaping parameter read from memory.

34. The method of claim 22 further comprising:

simulating the ferroelectric capacitor while being included in a larger electrical circuit, the larger electrical circuit being represented in memory in a circuit data file; and manufacturing a plurality of integrated circuits in accordance with the circuit data file.

35. The method of claim 22 wherein a ferroelectric model is used to simulate the ferroelectric capacitor, the ferroelectric model having a plurality of model values, the plurality of model values including: (1) an initial coercive voltage parameter Vc which characterizes a width of a hysteresis curve of the ferroelectric capacitor; and (2) an asymmetry parameter Vca which shifts the width of the hysteresis curve (Vc) by a voltage distance.

36. A method for simulating a ferroelectric capacitor comprising the steps of:

providing at least one maximum history data point and at least one minimum history data point in a history data file, wherein both the at least one maximum history data point and the at least one minimum history data point are data points where a derivative of a voltage with respect to time across the ferroelectric capacitor is zero;

identifying a current voltage/charge point for the ferroelectric capacitor; and decrementing the voltage across the ferroelectric capacitor and determining a charge stored in the ferroelectric capacitor by curve fitting between the current voltage/charge point and a nearest at least one minimum history data point.

37. The method of claim 36 wherein the step of decrementing comprises:
determining the nearest at least one minimum history data point as being a data point that is closest to the current voltage/charge point while still being lesser in voltage than the current voltage/charge point.

38. The method of claim 36 wherein the step of decrementing comprises:
curve fitting by calculating at least one exponential term wherein the at least one exponential term is some function of the voltage of the current voltage/charge point.

39. The method of claim 36 wherein the step of decrementing comprises:
finding the charge stored in the ferroelectric capacitor by using the equation:

$$Q = Q_0 \frac{\alpha \cdot \exp(a(V - V_c)) - \beta \cdot \exp(-a(V - V_c))}{\exp(-a(V - V_c)) + \exp(a(V - V_c))} + C_l V$$

where:
V=the voltage from the voltage/charge point
$V_c$=an initial coercive voltage parameter from memory, positive when V is increasing and negative when V is decreasing
$Q_o$=an initial saturated ferroelectric charge parameter from memory
$C_l$=an initial non-ferroelectric capacitor capacitance parameter from memory
a=a curve shaping parameter read from memory
α=a value between 0 and 1
β=a value between 0 and 1.

40. The method of claim 36 wherein the step of decrementing comprises:
curve fitting by reading a shaping parameter, a, from memory wherein the shaping parameter determines a curvature of hysteresis loops of the ferroelectric capacitor.

41. The method of claim 36 wherein a ferroelectric model is used to simulate the ferroelectric capacitor, the ferroelectric model having a plurality of model values, the plurality of model values including an initial saturated ferroelectric charge parameter Qo, an initial non-ferroelectric capacitor capacitance parameter Cl, and an initial coercive voltage parameter Vc which characterizes a charge/voltage curve of the ferroelectric capacitor wherein each of the model values Qo, Cl, and Vc are adjustable according to temperature.

42. The method of claim 41 wherein one or more of the model values Qo, Cl, and Vc are adjustable according to temperature by multiplying the model value by a polynomial temperature adjustment factor of the form: $(1+c_1(\Delta T)+c_2(\Delta T)^2)$ wherein:
ΔT is a change in temperature from a default temperature used to determine the initial saturated ferroelectric charge parameter Qo, the initial non-ferroelectric capacitor capacitance parameter Cl, and the initial coercive voltage parameter Vc;
$c_1$ is a different first constant for each of the initial saturated ferroelectric charge parameter Qo, the initial non-ferroelectric capacitor capacitance parameter Cl, and the initial coercive voltage parameter Vc; and
$c_2$ is a different second constant for each of the initial saturated ferroelectric charge parameter Qo, the initial non-ferroelectric capacitor capacitance parameter Cl, and the initial coercive voltage parameter Vc.

43. The method of claim 36 wherein the step of providing comprises:
selectively removing from the history data file, upon satisfaction of a predetermined condition, one maximum history data voltage/charge point and one minimum history data voltage/charge point wherein the one minimum history data voltage/charge point is adjacent in time to the one maximum history data voltage/charge point.

44. The method of claim 43 wherein the step of selectively removing comprises:
removing the one maximum history data voltage/charge point and the one minimum history data voltage/charge point from the history data file if a new maximum history data voltage/charge point is greater in value than the one maximum history data voltage/charge point.

45. The method of claim 43 wherein the step of selectively removing comprises:
removing the one maximum history data voltage/charge point and the one minimum history data voltage/charge point from the history data file if a new minimum history data voltage/charge point is lesser in value than the one minimum history data voltage/charge point.

46. The method of claim 36 further comprising:
selectively removing, over time, at least one pair of values from the history data file while simulation of the ferroelectric capacitor is progressing, the at least one pair comprising one maximum history data voltage/charge point and one minimum history data voltage/charge point.

47. The method of claim 36 wherein the step of decrementing further comprises:
curve fitting a maximum-size outer ferroelectric loop of the ferroelectric capacitor using a representation:

$$Q=Q_o \cdot \tan h(a(V-V_c))+C_l V$$

where:
V=the voltage from the voltage/charge point
$V_c$=an initial coercive voltage parameter from memory, positive when V is increasing and negative when V is decreasing
$Q_o$=an initial saturated ferroelectric charge parameter from memory
$C_l$=an initial non-ferroelectric capacitor capacitance parameter from memory
a=a curve shaping parameter read from memory.

48. The method of claim 36 further comprising:
simulating the ferroelectric capacitor while being included in a larger electrical circuit, the larger electrical circuit being represented in memory in a circuit data file; and
manufacturing a plurality of integrated circuits in accordance with the circuit data file.

49. The method of claim 36 wherein a ferroelectric model is used to simulate the ferroelectric capacitor, the ferroelectric model having a plurality of model values, the plurality of model values including: (1) an initial coercive voltage parameter Vc which characterizes a width of a hysteresis curve of the ferroelectric capacitor; and (2) an asymmetry parameter Vca which shifts the width of the hysteresis curve (Vc) by a voltage distance.

50. A ferroelectric circuit simulator comprising:
a plurality of computer instructions which uses a plurality of element models to simulate a behavior of ferroelectric electronic circuits; and
a ferroelectric capacitor model as one of the plurality of element models wherein the ferroelectric capacitor model comprises:

a saturated ferroelectric charge parameter Qo stored in memory;

a non-ferroelectric capacitor capacitance parameter Cl stored in memory;

a coercive voltage parameter Vc stored in memory; and wherein each of the Qo, Cl, and Vc parameters are adjusted for temperature so that the ferroelectric circuit simulator can accurately simulate ferroelectric electronic circuits over a range of temperatures.

51. A method for simulating a ferroelectric capacitor, the method comprising the steps of:

providing a ferroelectric capacitor having a first conductive capacitor electrode, a second conductive capacitor electrode, and a ferroelectric inter-level dielectric between the first and second conductive capacitor electrode, a geometric configuration of the first conductive capacitor electrode, the second conductive capacitor electrode, and the ferroelectric inter-level dielectric being stored in a computer design file;

storing in memory a plurality of default temperature simulation values;

providing a temperature at which the ferroelectric capacitor is to be simulated;

modifying, in response to the temperature, the plurality of default temperature simulation values to a plurality of temperature corrected simulation values; and using the plurality of temperature corrected simulation values to simulate the operation of the ferroelectric capacitor using a computer.

52. The method of claim 51 further comprising the step of:

manufacturing a plurality of integrated circuits containing the ferroelectric capacitor in accordance with the computer design file.

53. The method of claim 51 wherein the step of storing the plurality of default temperature simulation values comprises:

providing the plurality of default temperature simulation values including: (1) an initial saturated ferroelectric charge parameter Qo; (2) an initial non-ferroelectric capacitor capacitance parameter Cl; (3) and an initial coercive voltage parameter Vc which characterizes a charge/voltage curve of the ferroelectric capacitor wherein each of the model values Qo, Cl, and Vc are adjustable according to temperature via the step of modifying.

54. The method of claim 53 wherein the step of storing the plurality of default temperature simulation values comprises:

providing the plurality of default temperature simulation values including: (4) a shaping parameter (a) which alters a shape of a hysteresis curve associated with the ferroelectric capacitor.

55. The method of claim 53 wherein the step of storing the plurality of default temperature simulation values comprises:

providing the plurality of default temperature simulation values including: (4) an asymmetry parameter (Vca) which shifts a width of a hysteresis curve of the ferroelectric capacitor by a voltage distance.

56. A method for simulating a ferroelectric device, the method comprising the steps of:

providing a ferroelectric model of the ferroelectric device via a file in memory, the ferroelectric model containing an initial saturated ferroelectric charge parameter Qo, an initial non-ferroelectric capacitor capacitance parameter Cl, and an initial coercive voltage parameter Vc which characterizes a charge/voltage curve of the ferroelectric device;

providing, as input, a temperature at which ferroelectric simulation is to occur;

changing the initial saturated ferroelectric charge parameter Qo in response to the temperature to create a new saturated ferroelectric charge parameter Qo;

changing the initial non-ferroelectric capacitor capacitance parameter Cl in response to the temperature to create a new non-ferroelectric capacitor capacitance parameter Cl;

changing the initial coercive voltage parameter Vc in response to the temperature to create a new coercive voltage parameter Vc; and simulating the ferroelectric device at the temperature using the ferroelectric model along with the new saturated ferroelectric charge parameter Qo, the new non-ferroelectric capacitor capacitance parameter Cl, and the new coercive voltage parameter Vc.

57. A method for modeling a ferroelectric capacitor, the method comprising the steps of:

storing, over time, a plurality of data points into a history data file, the plurality of data points containing both maximum data points which contain a voltage value and a charge storage value and minimum data points which contain a voltage value and a charge storage value; and changing a voltage across the ferroelectric capacitor over time and using the plurality of data points in the history data file to perform curve fitting operations which allow a charge stored in the ferroelectric capacitor to be determined from the voltage which is changing.

58. A method for modeling a ferroelectric capacitor, the method comprising the steps of:

exercising a model of the ferroelectric capacitor by changing a voltage across the model of the ferroelectric capacitor, the exercising creating a plurality of hysteresis loops over time;

storing maximum voltage/charge points and minimum voltage/charge points attained when traversing each hysteresis loop over time; and using the maximum voltage/charge points and minimum voltage/charge points to adjust a charge in the model of the ferroelectric capacitor as the voltage across the model of the ferroelectric capacitor varies over time.

59. The method of claim 58 wherein the step of using comprises:

curve fitting with an equation that contains at least one exponential term.

60. The method of claim 58 wherein the step of storing comprises storing the maximum voltage/charge points and minimum voltage/charge points in a data file and the method further comprises:

removing selected maximum voltage/charge points and minimum voltage/charge points from the data file as the selected maximum voltage/charge points and minimum voltage/charge points are no longer needed for simulation.

61. A simulator for a ferroelectric device, the simulator comprising:

means for storing a plurality of history voltage/charge points which represent local extrema in a voltage placed across the ferroelectric device over time;

means for monitoring and selectively removing a sub-set of the plurality of history voltage/charge points as the sub-set of the plurality of history voltage/charge points are no longer needed for simulation; and means for using the plurality of history voltage/charge points to determine the charge stored in the ferroelectric device as the voltage, which is placed across the ferroelectric device, changes over time.

62. The simulator of claim 61 wherein the means for using further comprises:

means for curve fitting which determines a charge on the ferroelectric device as the voltage across the ferroelectric device changes over time, the curve fitting using parameters including: (1) an initial saturated ferroelectric charge parameter Qo; (2) an initial non-ferroelectric capacitor capacitance parameter Cl; (3) and an initial coercive voltage parameter Vc which characterizes a charge/voltage curve of the ferroelectric device.

63. The simulator of claim 62 wherein each of the model values Qo, Cl, and Vc are adjustable according to temperature so that the ferroelectric device can be simulated within a range of possible temperatures.

64. The simulator of claim 62 wherein the means for curve fitting comprises:

a shaping parameter (a) which alters a shape of a hysteresis curve associated with the ferroelectric device.

65. The simulator of claim 62 wherein the means for curve fitting comprises:

an asymmetry parameter (Vca) which shifts a width of a hysteresis curve of the ferroelectric device by a voltage distance.

66. The simulator of claim 61 wherein the simulator is a computer program and the means for storing, means for using, and means for monitoring are computer code segments stored on magnetic media.

67. The simulator of claim 61 wherein the simulator is a computer program and the means for storing, means for using, and means for monitoring are computer code segments stored via selectively etched trenches on an optical disk.

68. The simulator of claim 61 wherein the simulator is a computer program and the means for storing, means for using, and means for monitoring are computer code segments stored as binary values in integrated circuit storage comprising one or more of: static random access memory (SRAM), read only memory (ROM), dynamic random access memory (DRAM), flash memory, electrically erasable programmable read only memory (EEPROM), erasable programmable read only memory (EPROM), ferroelectric memory, and ferromagnetic memory.

* * * * *